United States Patent [19]
Eriguchi

[11] Patent Number: 6,069,090
[45] Date of Patent: *May 30, 2000

[54] METHOD AND APPARATUS FOR SEMICONDUCTOR DEVICE FABRICATION

[75] Inventor: Koji Eriguchi, Osaka, Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/550,900

[22] Filed: Oct. 31, 1995

[30] Foreign Application Priority Data

Jan. 11, 1994 [JP] Japan .................................... 6-268699

[51] Int. Cl.⁷ ................................................ H01L 21/302
[52] U.S. Cl. ......................... 438/714; 438/725; 216/59; 216/75; 216/71
[58] Field of Search ............................. 156/625.1, 643.1, 156/657.1, 659.11; 438/714, 9, 695, 696, 725, 706; 216/59, 60, 61, 79, 45, 58, 71, 75; 430/5

[56] References Cited

U.S. PATENT DOCUMENTS

| | | | |
|---|---|---|---|
| 5,242,536 | 9/1993 | Schoenborn | 156/643 |
| 5,354,418 | 10/1994 | Kumihashi et al. | 156/643 |
| 5,368,685 | 11/1994 | Kumihashi | 156/643 |
| 5,397,433 | 3/1995 | Gabriel | 156/665 |
| 5,587,090 | 12/1996 | Belcher et al. | 216/17 |
| 5,635,021 | 6/1997 | Harafuji | 438/714 |
| 5,711,848 | 1/1998 | Iturralde | 156/627.1 |

FOREIGN PATENT DOCUMENTS

| | | |
|---|---|---|
| 512677 | 11/1992 | European Pat. Off. . |
| 561402 | 9/1993 | European Pat. Off. . |
| 3-247783 | 11/1991 | Japan . |
| 5-136100 | 6/1993 | Japan . |
| 5-259119 | 10/1993 | Japan . |
| 5-267227 | 10/1993 | Japan . |
| 5-267249 | 10/1993 | Japan . |
| 5-275376 | 10/1993 | Japan . |

*Primary Examiner*—William Powell
*Assistant Examiner*—George Goudreau
*Attorney, Agent, or Firm*—McDermott, Will & Emery

[57] ABSTRACT

A polysilicon layer is formed on a silicon substrate. A resist film, which has a pattern of remaining portions and opening portions, is formed on the polysilicon layer. The silicon substrate is placed in a reaction chamber, an etch gas is introduced into the reaction chamber, and the introduced gas becomes ionized whereupon dry etching is performed to selectively etch away the polysilicon layer to form projections underneath the remaining portions and recesses underneath the opening portions. By controlling the pressure of the etch gas to fall within a range above 5 millitorr and the flow rate of the etch gas to fall within a range above 100 sccm, both the rate that an etch product is discharged above a recess and the rate that an etch product sticks to a projection sidewall are controlled. Such arrangement not only reduces a critical dimension difference (i.e., a difference in lateral dimension between the bottom of an isolated projection and a corresponding remaining portion of the resist film), but also cancels variations in the critical dimension difference between the isolated projection and the closely spaced projection.

9 Claims, 17 Drawing Sheets

GAS PRESSURE 100mTorr
GAS FLOW RATE 30sccm

GAS PRESSURE 100mTorr
GAS FLOW RATE 75sccm

GAS PRESSURE 100mTorr
GAS FLOW RATE 150sccm

GAS PRESSURE 100mTorr
GAS FLOW RATE 30sccm

GAS PRESSURE 100mTorr
GAS FLOW RATE 75sccm

GAS PRESSURE 100mTorr
GAS FLOW RATE 150sccm

GAS PRESSURE 20mTorr
GAS FLOW RATE 75sccm

GAS PRESSURE 100mTorr
GAS FLOW RATE 75sccm

MEAN VALUE 0.362(μm)
STANDARD DEVIATION 0.00974(μm)

MEAN VALUE 0.353(μm)
STANDARD DEVIATION 0.00682(μm)

MEAN VALUE 0.387(μm)
STANDARD DEVIATION 0.01097(μm)

MEAN VALUE 0.401(μm)
STANDARD DEVIATION 0.01729(μm)

METHOD AND APPARATUS FOR SEMICONDUCTOR DEVICE FABRICATION

BACKGROUND OF THE INVENTION

This invention relates to a method and apparatus for fabricating a semiconductor device. More specifically, it pertains to improvements in dry etching technology.

In the fabrication of semiconductor devices, dry etching techniques are used to produce a desired pattern on the surface of a workpiece. A typical patterning technique is made up of a photolithography process and a dry etching process. A photolithography process is a process step of creating a resist pattern having remaining portions and opening portions on a workpiece surface. A dry etching process is a process step of etching away portions of the workpiece corresponding to the opening portions of the resist pattern.

Here, a step of patterning a MOSFET gate electrode is described. As shown in FIG. 18(a), a silicon dioxide layer 7 that becomes a gate oxide layer is deposited on a silicon substrate 6, a polysilicon layer 4 is deposited on the silicon dioxide layer 7, and a resist is applied onto the polysilicon layer 4 to form a resist film 5. Thereafter, a pattern having remaining portions and opening portions is formed in the resist film 5 using a lithography technique. By making use of this resist film 5 as an etch mask, the polysilicon layer 4 is dry etched. 1 is an active species. 2 is an ion. 3 is an etch product produced during the dry etching process.

The polysilicon layer 4 is selectively etched such that recesses 9 are defined according to the opening portions of the resist film 5 and projections 8 are defined according to the remaining portions of the resist film 5, in other words a recess 9 is formed underneath an opening portion and a projection 8 is formed underneath a remaining portion. Referring to FIG. 18(a), there are illustrated two types of projections, i.e., a projection 8a and a projection 8b. The projection 8a is called an isolated projection because it is isolated from its neighboring projection with a great distance. On the other hand, the projection 8b is called a closely spaced projection because, unlike the isolated projection 8a, it is located close to another projection. Additionally, there is an isolated recess 9a on the side of the isolated projection 8a. On the other hand, there is a closely spaced recess 9b on the side of the closely spaced projection 8b. When the polysilicon layer 4 is etched according to the etch mask, the projections 8a, 8b become gate electrodes. Then, the patterning of gate electrodes is completed. In a dry etching technique that uses a reactive gas as an etchant, an etch product, which is produced by reaction between a workpiece and an etch gas, by decomposition of an etch gas, or by the like, sticks to the sidewalls of the projection 8. Such adhesion prevents etching in the lateral direction, and etching proceeds mainly downward, which is called the anisotropic etching. This anisotropic etching enables the projection 8 to have nearly vertical sidewalls, so that the projection 8 and the remaining portion of the resist film 5 come to have almost the same lateral dimension. Therefore, dry etching has been considered one of the most important techniques for semiconductor fine processing.

In recent years, technology for the miniaturization of semiconductor devices has advanced, which however produces the problem that there occurs a CD difference (CD gain and CD loss) between a master pattern and a workpiece pattern in a patterning process. CD stands for critical dimension. In the photolithography process, a resist film acts as a workpiece and therefore CD difference in the photolithography is a dimensional difference between a reticle pattern and a resist pattern. On the other hand, CD difference in the dry etching process is a dimensional difference between a resist pattern and a post-dry etching workpiece pattern, in other words, the dry-etching CD difference is a difference in the lateral dimension between a remaining portion of the resist film and a projection bottom.

These CD differences result from: (i) post-bake expansion and contraction of resist materials for patterning, and focus deviation when a resist is exposed during the photolithography process, and (ii) increase in the bottom dimension of projections caused by excessive adhesion of an etch product to projection sidewalls, and decrease in the bottom dimension of projections caused by side etching due to short adhesion of an etch product to projection sidewalls during the dry etching process.

CD differences produced during the dry etching process (dry-etching CD differences) are first described. For example, when polysilicon is etched using a conventional RIE (reactive ion etching) technique, CD differences are likely to occur, especially when HBr gas is used. The isolated projection 8a suffers from a severer CD difference than the closely spaced projection 8b. For example, suppose that a polysilicon layer corresponding to a gate length of about 0.5 $\mu$m is patterned. For the case of the isolated projection 8a, the amount of dimensional increase of W2 (the bottom width of the projection 8a) with respect to W1 (the width of the remaining portion of the resist film 5) is about 0.05 $\mu$m (see FIG. 18(b)). That is, W2 is greater than W1 by about 0.05 $\mu$m. On the other hand, for the case of the closely spaced projection 8b, the amount of dimensional increase of W2 (the bottom width of the projection 8b) with respect to W1 is close to zero (0.00 $\mu$m). Generally, a single semiconductor device contains therein an array of memory cells where transistors are densely placed and peripheral circuits where transistors are sparsely placed. Depending upon the location of transistors, variations in the CD difference from a mask pattern occur. As a result, the precision of the gate length of MOSFETs in a peripheral circuit becomes poor. This produces problems with the device electrical characteristics and the yield.

In order to prevent the occurrence of severe CD differences, a technique without using HBr gas has been proposed. For example, a high-vacuum etcher (e.g., an ECR that makes use of electron cyclotron resonance and a plasma source that makes use of helicon waves) has been proposed for the reduction of CD difference.

In photolithography technology, for the reduction of CD difference, various approaches have been tried. For example, the wavelength of light beams used for exposure is shortened and the mechanical accuracy of optical systems is improved. Presently, such mechanical accuracy has been improved to such an extent that processing accuracy corresponding to the wavelength of exposure light is obtained. For example, with respect to 0.35-$\mu$m design rule devices, a current standard processing accuracy is about ±0.04 $\mu$m when i-lines are used.

It has been known that CD differences in the photolithography process vary depending on the type of pattern. Generally, isolated projections suffer from a severer CD difference than closely spaced projections. Conventionally, a reticle pattern is pre-dimensioned in accordance with an expected CD difference for CD difference cancellation to a certain degree.

Many of the semiconductor manufacturers in the world are now trying to control each process steps of the fabrication of semiconductor devices by means of computers. In other words, the semiconductor industry aims at not only improving the basic characteristics of workpieces at each fabrication process step but also achieving FMS (flexible manufacturing system) by controlling individual wafers. Therefore, the reduction of variations in the device characteristic by controlling variations in the CD difference between each wafer has been considered important. Some semiconductor manufacturers are trying to individually control fabrication process steps, to control information about each wafer, and to control variations in the product characteristic, for accomplishing the uniformity of performance of products.

In the above-described dry etching and photolithography processes, the following disadvantages are produced.

Even in a dry etching process performed by a high-vacuum etcher, an isolated projection suffers from a severe CD difference, and the isolated-projection CD difference is different from the closely spaced-projection CD difference. Conventional techniques find it hard to cancel CD differences. Variations in the CD difference are considered one of the main factors that decrease the yield when technology for the miniaturization of semiconductor devices further advances in the future. As described above, it is extremely hard for a conventional RIE-type etcher or a high-vacuum etcher to suppress variations in the CD difference.

Additionally, it is expected that control of the cross-sectional profile of projections (i.e., gate electrodes formed by etching) becomes important in the future. However, it is extremely difficult to accomplish such control.

Meanwhile, there are limits to which the wavelength of exposure light is shortened and there are also limits to which mechanical accuracy (e.g., the accuracy of lenses and the accuracy of alignment of components) is improved. Therefore, it seems impossible to expect remarkable improvements in the processing accuracy. Additionally, even if the CD difference is reduced by reducing the dimension of reticle patterns, there still occur variations in the CD difference in a photolithography process. Although it has been recognized that such variations occur, it is hard to thoroughly cancel it due to mechanical limitations. Further, the miniaturization of devices presents new problems. For example, variations in the CD difference that have been conventionally considered negligible now become critical.

If information control at wafer level is made, and if final CD differences are made to become as constant as possible between wafers by controlling dry-etching CD differences on the basis of photolithography CD difference information for each wafer, this enables the production of devices having a uniform characteristic. It is also possible to allow an isolated projection and a closely spaced projection to have almost the same finish dimension by means of reduction of the dimension of photolithography masks.

To sum up, if the sum of a CD difference produced in a photolithography process and a CD difference produced in a dry etching process is made to become fixed, this reduces the degree of variations in the CD difference between wafers.

SUMMARY OF THE INVENTION

Accordingly, a first object of this invention is to clarify a mechanism of how variations in the CD difference occur in a dry etching process and to provide a method and apparatus for fabricating a semiconductor device capable of controlling dry-etching CD difference variations and workpiece cross-sections.

A second object of this invention is to control dry-etching CD differences in such a way that the sum of a photolithography CD difference and a dry-etching CD difference becomes fixed (i.e., the CD difference between a master pattern and a final workpiece pattern). More specifically, the CD difference is controlled in wafer by a computer and etch parameters (e.g., the gas flow rate) are changed in a dry etching process so that a specific CD difference is produced.

The mechanism of how CD differences occur, which became clarified as this invention was developed, is first explained.

Generally, in the dry etching process, an etch gas in the state of plasma reacts with a decomposition product from a portion to be etched, to form an etch product. The etch product produced sticks to the sidewalls of a recess, whereupon lateral etching is adequately prevented and anisotropic etching is accomplished. However, especially for the case of an isolated projection, it is likely that the bottom width of an isolated projection becomes greater than the width of a corresponding remaining portion of the etch mask. The reason for this may be considered as follows. The amount of production of an etch product increases at a recess because the distance between isolated projections (the recess width) is great. As a result, the etch product excessively sticks to the sidewalls and etching is prevented excessively. This is illustrated by making reference to FIGS. 18(a)–18(c).

In the recess 9, the active species 1 sticks to the polysilicon layer 4 to be etched (see FIG. 18(a)). The ion 2 strikes on the surface of the polysilicon layer 4 and its kinetic energy promotes reaction so that etching progresses. However, the amount of adhesion of the etch product 3 to the sidewalls of the closely spaced projection 8b is different from the amount of adhesion of the etch product 3 to the sidewalls of the isolated projection 8a. In other words, the width of the isolated recess 9a on the side of the isolated projection 8a is great, thereby creating a greater etch area. Therefore, the amount of adhesion of the etch product 3 to the sidewall of the isolated projection 8a is large. In other words, the film thickness of a deposition on the sidewall increases, thereby enhancing the action of preventing lateral etching. As a result, as shown in FIG. 18(b), W2 (the bottom width of the isolated projection 8a) becomes greater than W1 (the top width of the isolated projection 8a=the dimension of the corresponding remaining portion of the resist film 5). The width of the closely spaced recess 9b between the closely spaced projections 8b is narrow, thereby producing a smaller etch area. Therefore, the amount of adhesion of the etch product 3 to the sidewall of the closely spaced recess 9b is small. This reduces the action of preventing etching towards the sidewall. Accordingly, as shown in FIG. 18(c), there is little or no difference between the bottom width W2 and the top width W1 of the closely spaced projection 8b. In this way, the CD difference of the isolated projection 8a becomes greater than the CD difference of the closely spaced projection 8b.

It is presumed that the above-described mechanism causes variations in the CD difference between devices (e.g., transistors) placed in a single chip.

In accordance with the present invention, the CD difference of isolated projections is reduced by controlling projection cross-sections, to cancel variations in the CD difference between isolated projections and closely spaced projections.

The present invention provides a first method of fabricating a semiconductor device. The first semiconductor device fabrication method comprises the steps of:

(a) placing in a reaction chamber a semiconductor wafer having on a surface thereof a layer to be etched which is covered by an etch mask having a pattern of remaining portions and opening portions, and introducing an etch gas into the reaction chamber; and (b) performing a dry etching process to selectively etch away the layer through the etch mask to form projections underneath the remaining portions and recesses underneath the opening portions;

wherein both the pressure and the flow rate of the etch gas in the reaction chamber are controlled for controlling the rate that an etch product produced during the dry etching process is discharged to outside the recess, and for controlling the rate that an etch product sticks to sidewalls of the projection, in order to have a critical dimension difference, which is a difference in lateral dimension between the bottom of the projection and the remaining portion, fall in a predetermined range.

Such control of the gas pressure and the gas flow rate achieves control of the CD difference of a layer to be etched. Although such a mechanism has not been clarified yet, it is presumed that the following actions are involved.

When the gas pressure is increased, both the active species 1 and the etch product 3 come to have a mean free path ($\lambda$) sufficiently smaller than the reaction chamber dimension (d) (or the wafer size) (for example, when P=100 millitorr and d=20 cm). $\lambda$ is determined mostly by the etch pressure (p). Then, the state of gas becomes a viscous flow. At this time, a neutral gas acts as a resistor when an etch product is about to stick to a projection sidewall. When both the gas pressure and the gas flow rate are further increased, a strong turbulent flow is created in the recess 9, which enhances the action of preventing an etch product from sticking to the sidewall. Because of these two actions, when the gas pressure and the gas flow rate increase, the rate that an etch product sticks to a projection sidewall decreases.

When the gas pressure increases, the weight of gas per unit volume likewise increases, in other words, the viscosity increases. As a result, the efficiency of transport of an etch product increases, which enhances the action of discharging an etch product to an overhead space. In other words, the etch product 3, which contributes to protecting a projection sidewall against etching, is caught in a flow of gas in bulk and is discharged. Additionally, in the reaction chamber, a space over a gas flow towards the vicinity of the bottom and sidewall of a recess which has little or no flow and which is in the state of static pressure, is in the state of negative pressure. As the gas flow rate increases the difference between negative pressure and positive pressure likewise increases, which promotes discharge of an etch product. In other words, when either the gas pressure or the gas flow rate increases, the rate that the etch product 3 is discharged by the foregoing actions as well as by the foregoing strong turbulent flow to an overhead space likewise increases.

If either the gas pressure or the gas flow rate is decreased, the rate that the etch product 3 sticks to a projection sidewall increases.

The gas pressure and the gas flow rate are controlled and the above-described actions relate to each other wherein one of the actions is a main action, whereupon it becomes possible to control both the rate that an etch product is discharged to an overhead space and the rate that an etch product sticks to a sidewall. This not only facilitates control of the cross section of projections, but also reduces the CD difference of isolated projections.

It is preferable that in the first method the gas pressure is greater than or equal to 5 millitorr and the gas flow rate is greater than or equal to 100 sccm.

As a result of such arrangement, the gas viscosity increases, the difference in pressure between a recess sidewall and an overhead space increases, and the strength of turbulent flow increases. Therefore, the efficiency of transport of an etch product to an overhead space is enhanced and the CD difference is reduced.

In the first method, at least one of the projections may be an isolated projection which has a bottom having a lateral dimension less than or equal to 0.4 $\mu$m and which is sandwiched between recesses each having a lateral dimension greater than or equal to 1 $\mu$m.

Accordingly the form of isolated projections with a great CD difference is improved.

It is possible that in the first method at least one of the projections is an isolated projection which is sandwiched between recesses having a lateral dimension greater than or equal to 1 $\mu$m and wherein the remaining projections are projections which are closely spaced in such a way as to define therebetween a recess with a lateral dimension less than or equal to 1 $\mu$m.

As a result of such arrangement, the following advantages are obtained. Variations in the CD difference between isolated projections and closely spaced projections are suppressed. In other words, when the gas flow velocity is increased gradually, the velocity of discharge of the etch product 3 is likewise increased as shown in FIG. 1(a), which means that the time of residence of the etch product 3 over the etch surface becomes shorter. The effect of shortening the residence time varies depending upon the etch pattern. In the isolated recess 9a, the etch product 3 is likely to be influenced by the gas flow and therefore the effect of shortening the residence time is exhibited obviously. On the other hand, the closely spaced recess 9b has a narrow, complicated topography so that the residence time of the etch product 3 is unlikely influenced by the gas flow. As a result, the reduction of variations in the CD difference is accomplished, since the closely spaced projection CD difference varies little while the isolated projection CD difference decreases as the gas flow rate increases.

It is preferable that in the first method a product of the pressure of gas in the reaction chamber and the diameter of the reaction chamber is greater than or equal to 0.2 Kg/sec$^2$.

Accordingly, there is obtained power capable of transporting an etch product from a recess to an overhead space. This facilitates control of the CD difference.

It is preferable that in the first method the etch gas contains at least either one of a halogen gas and a halide gas.

It is preferable that in the first method the halogen gas is either a hydrogen bromide gas, a mixture of a hydrogen bromide gas and a chlorine gas, or a mixture of a hydrogen bromide gas and a hydrogen chloride gas.

Accordingly high-dry etching efficiency is performed and CD differences become controllable.

It is possible that in the first method the layer to be etched is formed of a material that contains at least either one of single-crystal silicon, polysilicon, Al, Cu, W, Ti, Co, Ta, Mo, or Ni.

As a result of such arrangement, the precision of form of various devices as well as the precision of form of wirings is improved.

The first method of the present invention further includes:

(c) performing a photolithography process to form an etch mask of a resist film;

(d) measuring the lateral length of a remaining portion of the etch mask; and (e) determining the pressure and the flow rate of the etch gas in the reaction chamber according to a result of the step (d);

wherein in the step (b) dry etching is performed according to results of the step (e).

As a result of such arrangement, it becomes possible to control the dry-etching CD difference in consideration of the difference between the dimension of an etch mask and the finish dimension of a layer to be etched. The precision of finish of a layer to be etched improves, accordingly.

In a photolithography process to form an etch mask, variations in the CD difference between wafers (i.e., the difference between the reticle dimension and the etch mask dimension) include statistical variations. Generally, statistical variations form a normal distribution and its central value is a mean CD difference in a photolithography process. Likewise, in a dry etching process, variations in the CD difference between wafers (i.e., the difference between the resist pattern dimension and the post-etching dimension) include statistical variations forming a normal distribution.

In a conventional semiconductor-device fabrication method in which photolithography and dry etching processes are not related to each other, the mean value of the finish dimension of a layer to be etched deviates from a target dimension by the sum of a photolithography CD difference and a dry-etching CD difference. Statistically, the finish dimension of a layer to be etched varies greatly because of superposition of variation in the photolithography CD difference and variation in the dry-etching CD difference.

Conversely, in accordance with the present invention, dry-etching CD differences are controlled in such a way as to rectify CD differences produced in a photolithography process, whereupon the mean value of the finish dimension of a layer to be etched almost corresponds to a target value. Additionally, dry-etching CD differences are controlled in such a way as to cancel variations in the etch mask dimension produced in a photolithography process. Reduction of variations in the finish dimension of a layer to be etched is accomplished.

It is possible that in the step (b) the pressure of gas in the reaction chamber is fixed and the determined gas flow rate is used as an exogenous parameter for gas flow rate control.

Because of such arrangement, control of the gas flow rate can be performed more easily than control of the gas pressure, whereupon control of the state of in-chamber gas is facilitated and a layer to be etched is dimensioned to a target dimension.

It is possible that the step (d), the step (e), and the gas flow rate control in the step (b) are performed per semiconductor wafer.

Accordingly, while achieving reduction of variations in the finish dimension of a layer to be etched, a dry etching process can be performed in consideration of hysteresis of individual wafers. A semiconductor-device fabrication method suitable for FMS (flexible manufacturing system) is provided.

The step (e) may determine a gas flow rate by approximating a critical dimension difference versus gas flow rate relationship for a predetermined gas pressure by a hyperbolic function.

Accordingly, fast determination of an adequate gas flow rate for dry etching is achieved on the basis of the experimentally-obtained fact that the relationship between a CD difference and a gas flow rate can be approximated by hyperbolic functions. Therefore, steps of the semiconductor device fabrication are smoothly performed. It is experimentally proved that a CD difference (d) versus gas flow rate (f) relationship can be approximated by a hyperbolic function: $(d-do)(f-fo)=A$, where $do$, $fo$, and $A$ are constants determined by the gas pressure. This means that, if the CD difference versus gas flow rate relationship for a predetermined gas pressure with respect to various materials for a layer to be etched and various gases, is fully understood, this quickly determines an adequate gas flow rate for a dry etching process by measurement of remaining portions of an etch mask.

The step (c) may form an etch mask in such a way that a remaining portion thereof corresponding to an isolated projection of the layer to be etched, has a lateral dimension smaller than a finish dimension of the isolated projection by a predetermined value.

As a result of such arrangement, it is possible to allow a layer to be etched to have a desired finish dimension by having the bottom of an isolated projection have a lateral dimension greater than the lateral dimension of a corresponding remaining portion by a predetermined value. Accordingly, such a severe dry etching condition that a CD difference of zero is required may be eliminated, and control of semiconductor devices during the fabrication becomes easy.

The present invention provides an apparatus for fabricating a semiconductor device. This apparatus comprises:
   (a) a reaction chamber for accommodating a semiconductor wafer having on a surface thereof a layer to be etched which is covered with an etch mask having a pattern of remaining portions and opening portions;
   (b) gas supply means for introducing an etch gas into the reaction chamber;
   (c) plasma generation means for bringing the etch gas into the state of plasma to perform a dry etching process to selectively etch away said layer to form projections underneath the remaining portions and recesses underneath the opening portions; and
   (d) control means for controlling at least either one of the pressure and the flow rate of the etch gas in the reaction chamber, to have a critical dimension difference, which is a difference in lateral dimension between the bottom of the projection and the remaining portion, fall in a predetermined range.

The gas supply means may introduce into the reaction chamber the etch gas at a predetermined pressure and the control means is operable to change the flow rate of the etch gas in the reaction chamber.

As a result of such arrangement, it becomes possible to control the CD difference with ease. This provides an improved semiconductor device with a layer to be etched having high finish dimension precision.

The control means may include:
   (d-1) adjustment means for adjusting at least either one of the gas pressure and the gas flow rate;
   (d-2) memory means for storing, in the form of a database, a critical dimension difference versus gas pressure relationship and a critical dimension difference versus gas flow rate relationship obtained from pre-measurement of an already-etched sample which is formed of the same material as the layer and is covered with the same pattern as the layer.
   (d-3) arithmetic means for performing, based on the relationships, arithmetic operations to find a gas pressure and a gas flow rate in order for the projection to have a bottom having a desired dimension;
   (d-4) transfer means for providing results of the arithmetic operation to the adjustment means.

It is preferable that the arithmetic means determines a gas flow rate by approximating a critical dimension difference versus gas flow rate relationship for a predetermined gas pressure by a hyperbolic function.

As result of such arrangement, it becomes possible to quickly determine an adequate gas flow rate condition in a dry etching process and to provide an inexpensive semiconductor device with a layer to be etched having high finish dimension precision.

It is preferable that the gas supply means introduces into the reaction chamber the etch gas that contains at least either one of a halogen gas and a halide gas.

It is preferable that the halogen gas is either a hydrogen bromide gas, a mixture of a hydrogen bromide gas and a chlorine gas, or a mixture of a hydrogen bromide gas and a hydrogen chloride gas.

It is preferable that the layer is formed of a material that contains at least either one of single crystal silicon, polysilicon, Al, Cu, W, Ti, Co, Ta, Mo, or Ni.

DETAILED DESCRIPTION OF THE INVENTION

Embodiment 1

Figure 1A:
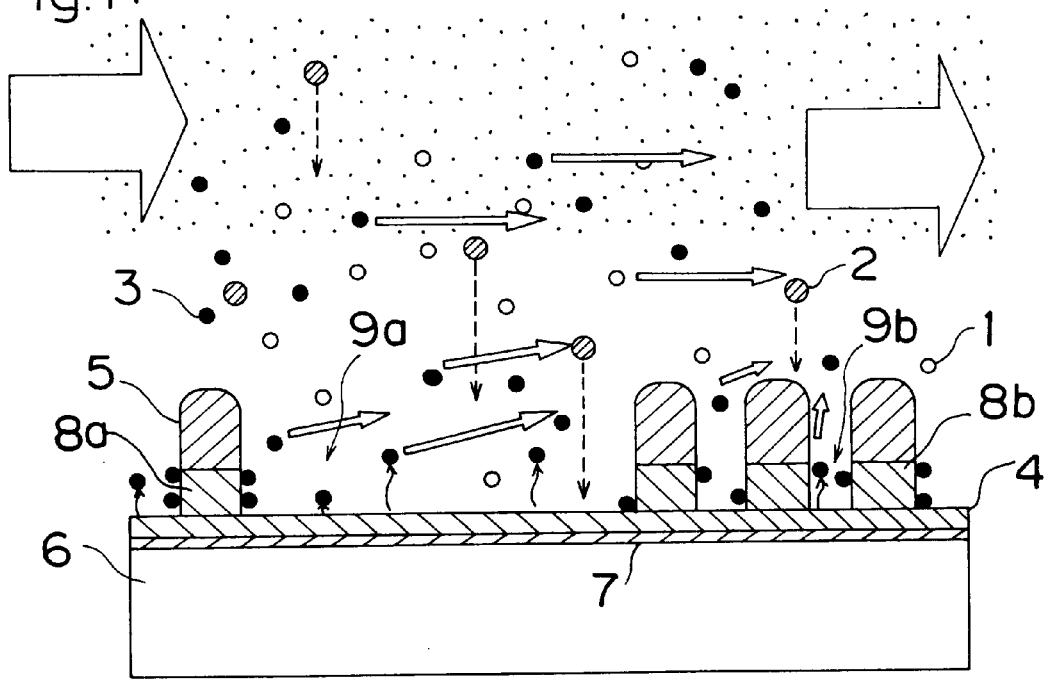
FIGS. 1(a)–1(c) illustrate in cross section a silicon substrate, an isolated projection, and a closely spaced projection, respectively, in a dry etching process of the present invention.
Figure 1B:
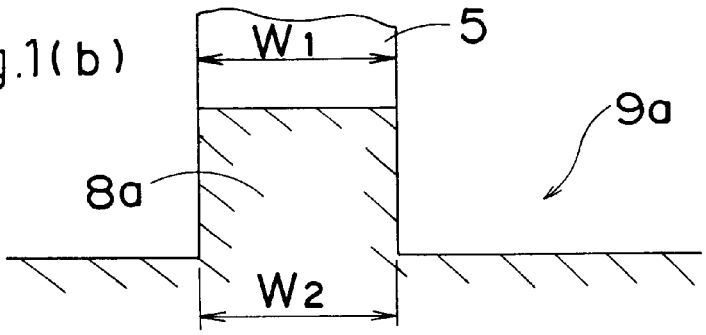
Figure 1C:
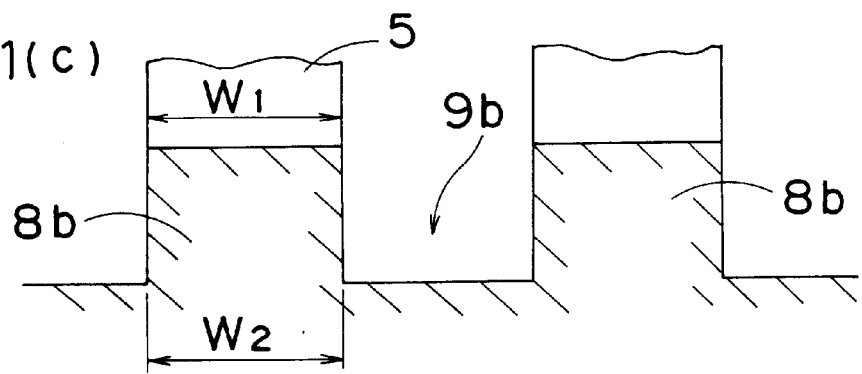
Figure 2:
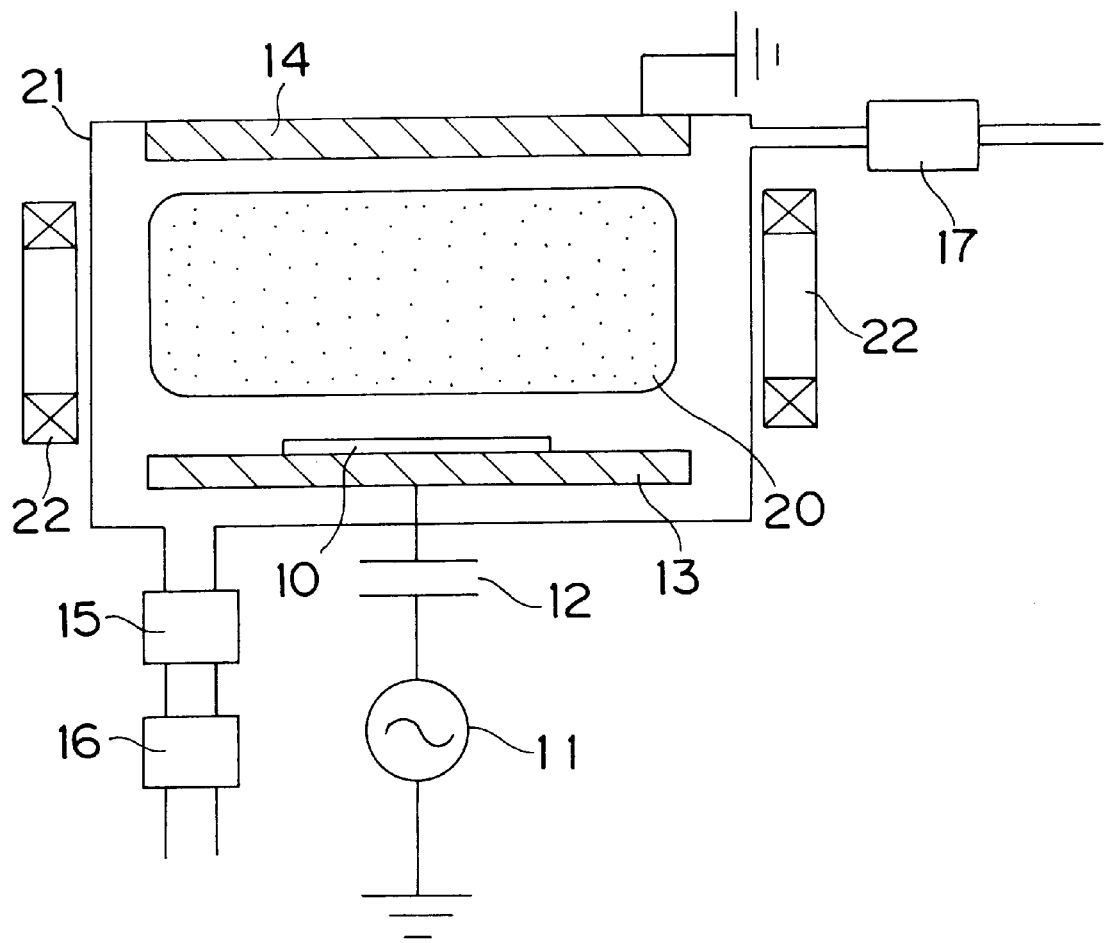
FIG. 2 schematically depicts a dry etching apparatus used in a first embodiment of the present invention.

A first embodiment of this invention is described. FIG. 2 outlines the structure of a medium vacuum region magnetron RIE apparatus in the first embodiment. 21 is a reaction chamber. 22 is an electromagnetic coil. 10 is a test sample such as an LSI semiconductor wafer. 11 is a high-frequency power source (e.g., 13.56 MHz). 12 is a coupling capacitor. 13 is a cathode electrode. 14 is an anode electrode. 15 is a turbo molecular pump. 16 is a rotary pump. 17 is a mass flow controller. 20 indicates a plasma generation region. Anode electrode 14 is grounded. Gas within reaction chamber 21 is discharged by turbo molecular pump 15 and rotary pump 16 to outside through an outlet. Mass flow controller 17 controls the flow rate of inflow gas to reaction chamber 21.

Figure 3:
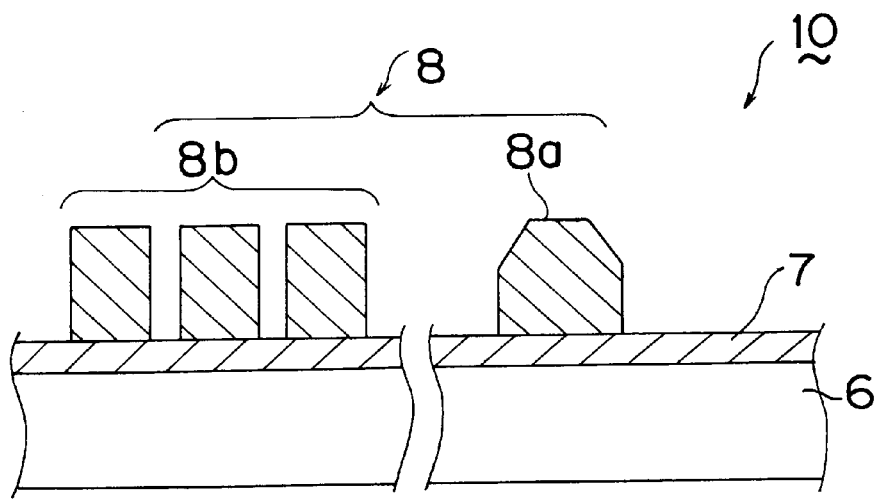
FIG. 3 cross sectionally illustrates a portion to be etched.

Referring to FIG. 3, there is illustrated a portion to be etched. Formed on silicon substrate 6 is gate oxide layer 7. Polysilicon layer 4 to be etched is deposited on gate oxide layer 7. Projections 8 acting as gate electrodes are formed from polysilicon layer 4. Isolated projection 8a and closely spaced projection 8b are formed according to the placement of transistors.

At the time of performing a dry etching process, reaction chamber 21 having a chamber radius of about 20 cm is filled with gas in a viscous region at a gas pressure of 100 millitorr. Thereafter, 215 W of electric power from high-frequency power source 11 propagates to cathode electrode 13 via coupling capacitor 12. This electric power, together with a magnetic field produced by electromagnetic coil 22, ionizes an etch gas composed of HBr and $Cl_2$ introduced in reaction chamber 21, to create plasma generation region 20. Polysilicon is etched in an ion assist manner by both Br radicals that are active species dissociated from the HBr gas and Cl radicals dissociated from the $Cl_2$ gas. $SiBrx$ (x=1, 2, 3, 4), i.e., a product resulting from the etching, sticks to sidewalls to be etched, thereby preventing the action of side etching.

Figure 4A:
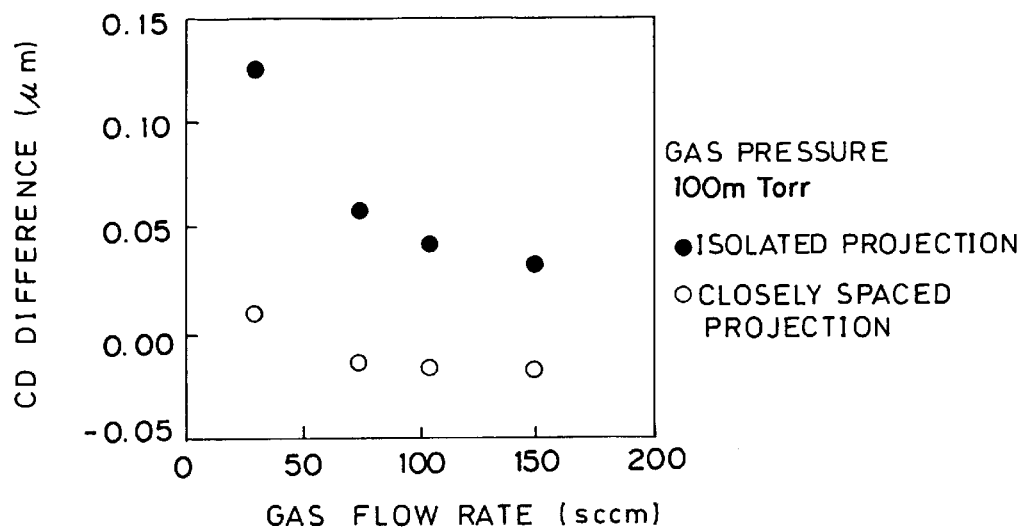
FIG. 4(a) shows the CD difference at various gas flow rates at a gas pressure of 100 millitorr and FIG. 4(b) shows the CD difference at various gas flow rates at a gas pressure of 50 millitorr.
Figure 4B:
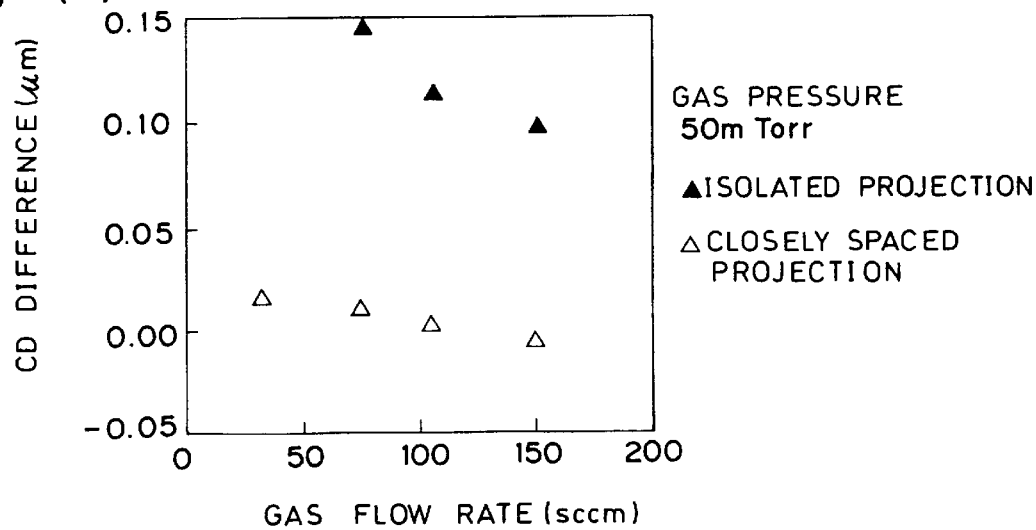

In the present embodiment, as the total flow rate of an etch gas (HBr and $Cl_2$) increases, the difference between the amount of adhesion of an etch product to the sidewall of the isolated projection 8a and the amount of adhesion of an etch product to the sidewall of the closely spaced projection 8b is reduced. FIG. 4a shows the total gas flow rate for the CD difference at a gas pressure of 100 millitorr. If the gas pressure=100 millitorr and the total gas flow rate $\geq 100$ sccm, then variations in the CD difference can be reduced down to 0.04 μm on average. This not only cuts the CD difference variation in half in comparison with a conventional method using a gas flow rate of about 50 sccm, but also improves the yield of device. FIG. 4b shows the total gas flow rate for the CD difference at a gas pressure of 50 millitorr. As can be seen from the figure, even in such a condition that the gas pressure is 50 millitorr the CD difference variation is cut in half.

Additionally, the fact to be noted is that the CD difference of isolated projections varies nearly inversely with the total gas flow rate. In other words, it is possible to control only isolated-projection CD differences by controlling the gas flow rate. Therefore, even when the dimension of a remaining portion becomes too great in patterning a photoresist film, it is possible to rectify such an excess by gas flow rate control so as to provide a target finish dimension.

Furthermore, during the etching process, the cross-sectional profile of the projection 8 can freely be controlled by changing the gas flow rate in time so as to vary the amount of adhesion of an etch product to the sidewall.

In the present embodiment, only the isolated projection 8a has a trapezoid form. In this case, the gas flow rate is increased from 75 sccm up to 150 sccm during the etching process.

Embodiment 2

Figure 5:
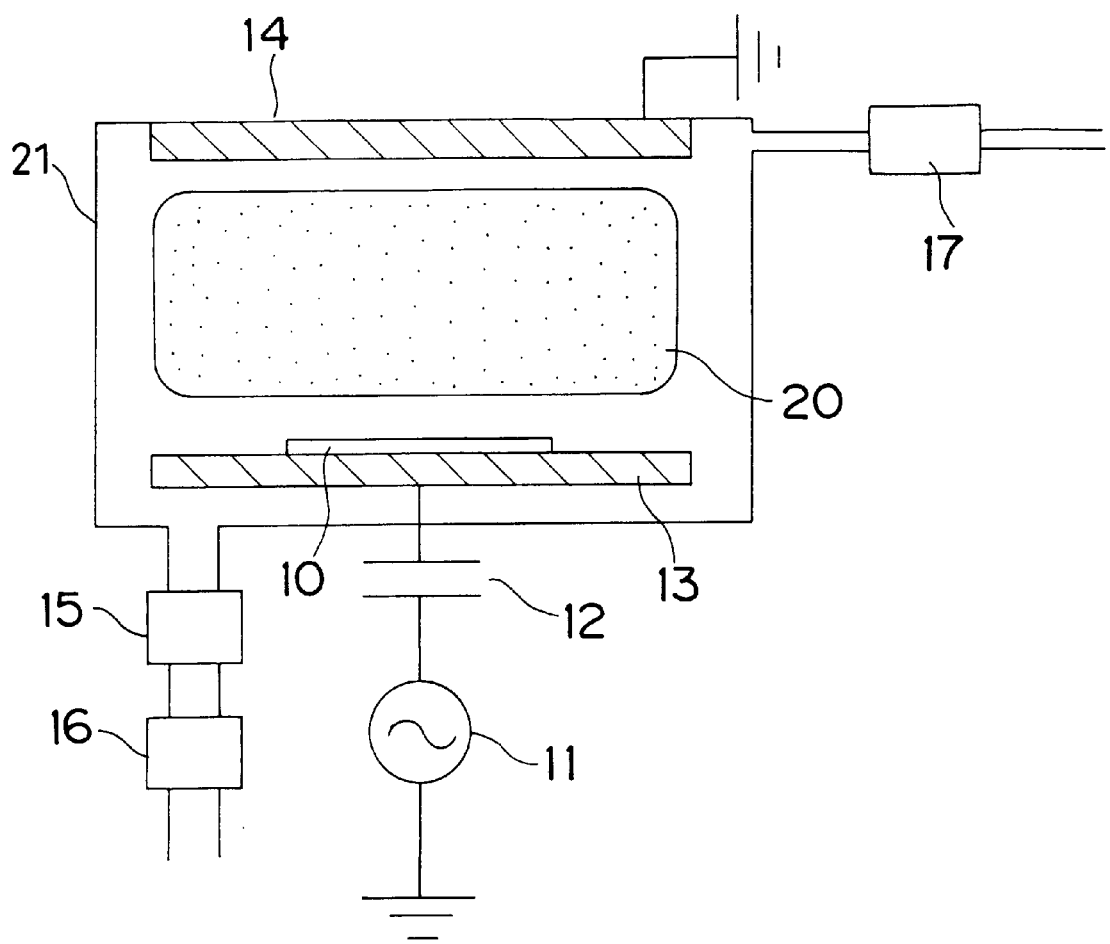
FIG. 5 schematically depicts a dry etching apparatus used in a second embodiment of the present invention.

A second embodiment of the present invention is now explained below. FIG. 5 outlines the structure of a medium vacuum magnetron RIE apparatus in the second embodiment. 21 is a reaction chamber. 10 is a test sample such as an LSI semiconductor wafer. 11 is a high-frequency power source (e.g., 13.56 MHz). 12 is a coupling capacitor. 13 is a cathode electrode. 14 is an anode electrode. 15 is a turbo molecular pump. 16 is a rotary pump. 17 is a mass flow controller. 20 indicates a plasma generation region. Anode electrode 14 is grounded. Gas within reaction chamber 21 is discharged by turbo molecular pump 15 and rotary pump 16 to outside through an outlet. Mass flow controller 17 controls the flow rate of inflow gas to reaction chamber 21. Unlike the RIE apparatus in the first embodiment, the RIE apparatus in the present embodiment is not provided with an electromagnetic coil 22.

At the time of performing a dry etching process, reaction chamber 21 having a chamber radius of about 18 cm is filled with gas in a viscous region at a gas pressure of 180 millitorr. Thereafter, 200 W of electric power from high-frequency power source 11 propagates to cathode electrode 13 via coupling capacitor 12. This electric power ionizes an etch gas composed of HBr gas, HCl gas, and $O_2$ gas introduced in reaction chamber 21 to create plasma generation region 20. Like the first embodiment, polysilicon is etched, in an ion assist manner, by both Br radicals that are active species dissociated from the HBr gas and Cl radicals dissociated from the HCl gas.

Figure 6:
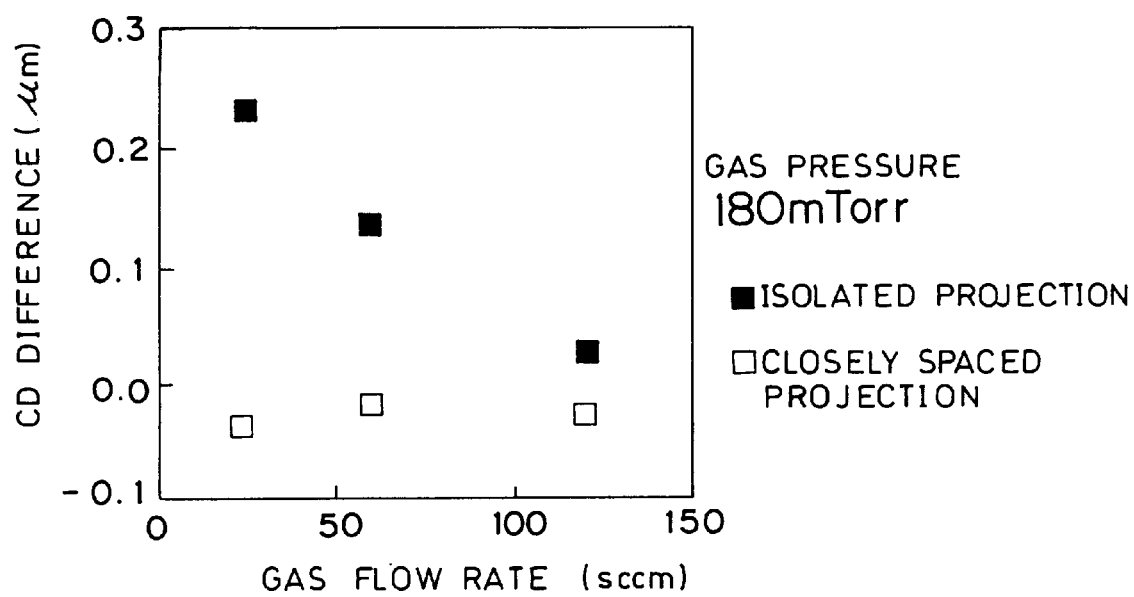
FIG. 6 shows the CD difference at various gas flow rates.

FIG. 6 shows the total gas flow rate versus the CD difference at a gas pressure of 180 millitorr. If the gas pressure=180 millitorr and the total gas flow rate ≧100 sccm, then variations in the CD difference can be reduced down to 0.04 µm on average. This not only greatly cuts the CD difference variation in comparison with a conventional method using a gas flow rate of about 45 sccm, but also improves the yield of device.

Like the first embodiment, the CD difference of isolated projections varies nearly inversely with the total gas flow rate. In other words, it is possible to control only the isolated-projection CD difference by controlling the gas flow rate. Additionally, during the etching process, the cross-sectional profile of projections can freely be controlled by changing a gas flow rate in time so as to vary the amount of adhesion of an etch product to the sidewall.

Summary of the First and Second Embodiments and Additional Testing Data

Next, the above-described first and second embodiments of this invention are summarized and the result of additional testing is explained. In the testing, a medium vacuum region magnetron RIE apparatus similar to the one employed in the first embodiment, is used.

Figure 7A:
FIGS. 7(a)–7(c) show SEM cross sections of isolated projections at a gas pressure of 100 millitorr for the following gas flow rates: (i) 30 sccm; (ii) 75 sccm; and (iii) 150 sccm.
Figure 7B:
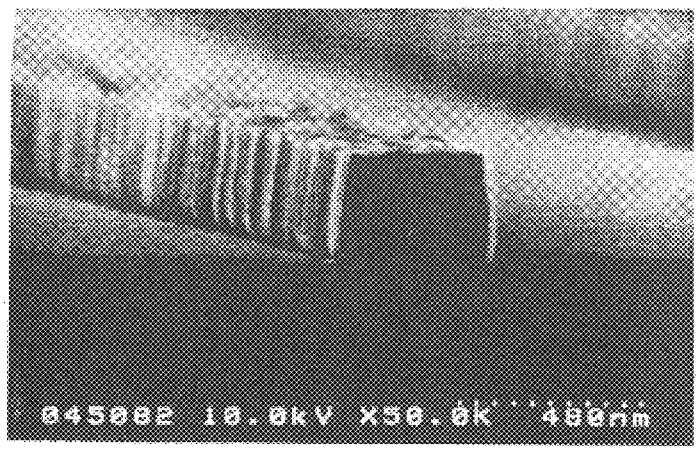
Figure 7C:
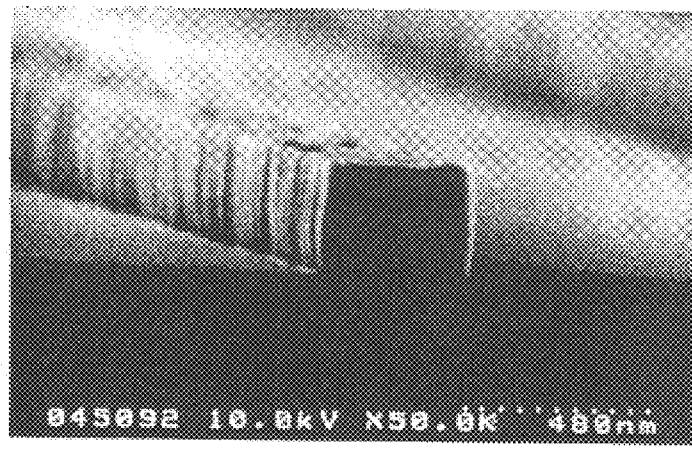
Figure 8A:
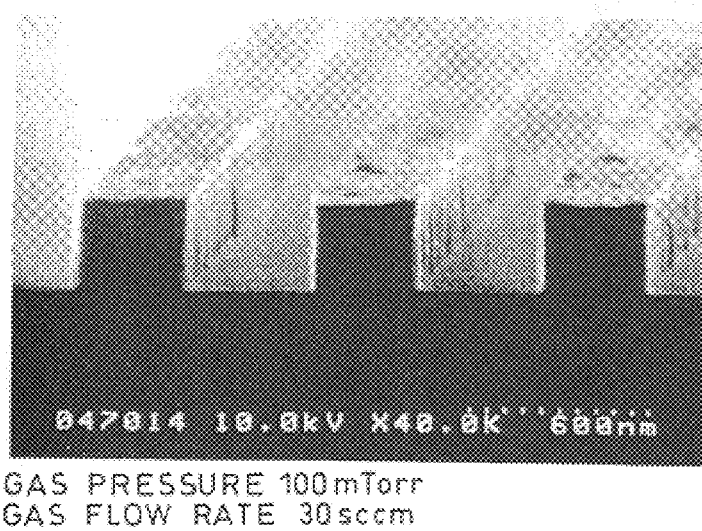
FIGS. 8(a)–8(c) show SEM cross sections of closely spaced projections at a gas pressure of 100 millitorr for the following gas flow rates: (i) 30 sccm; (ii) 75 sccm; and (iii) 150 sccm.
Figure 8B:
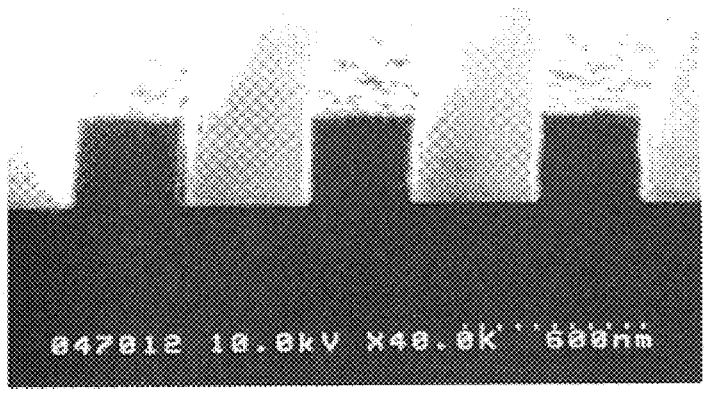
Figure 8C:
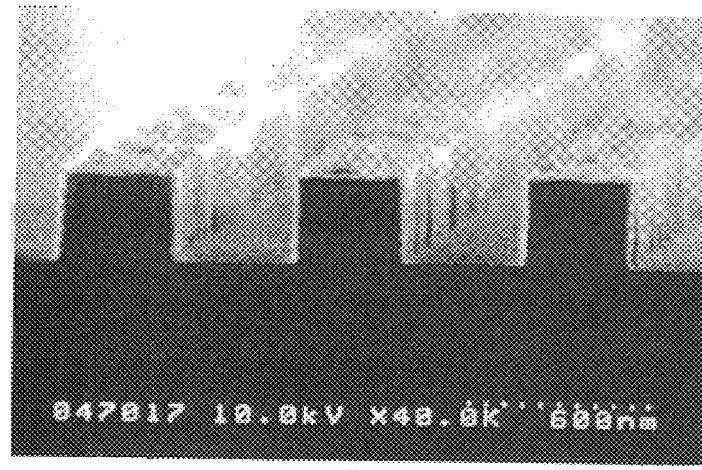

FIG. 7, comprised of (a), (b), and (c), shows three SEM (scanning electron microscope) photographs. More particularly, FIGS. 7(a)–(c) show SEM cross sections of isolated projections at a gas pressure of 100 millitorr for the following gas flow rates: (i) 30 sccm; (ii) 75 sccm; and (iii) 150 sccm. FIG. 8, comprised of (a), (b), and (c), shows three SEM photographs. More particularly, FIGS. 8(a)–(c) show SEM cross sections of closely spaced projections at a gas pressure of 100 millitorr for the following gas flow rates: (i) 30 sccm; (ii) 75 sccm; and (iii) 150 sccm. At 50 sccm, the bottom dimension of the isolated projection of FIG. 7(a) is greater than the top dimension thereof and the CD difference is great. In the FIG. 7(b) SEM photograph (the gas flow rate: 75 sccm), the CD difference is much reduced but not to zero. As can be observed from the FIG. 7(c) SEM photograph (the gas flow rate: 150 sccm), the CD difference is almost zero. On the other hand, as can be observed from FIGS. 8(a)–(c) SEM photographs, each CD difference is almost zero regardless of the gas flow rate.

Figure 9A:
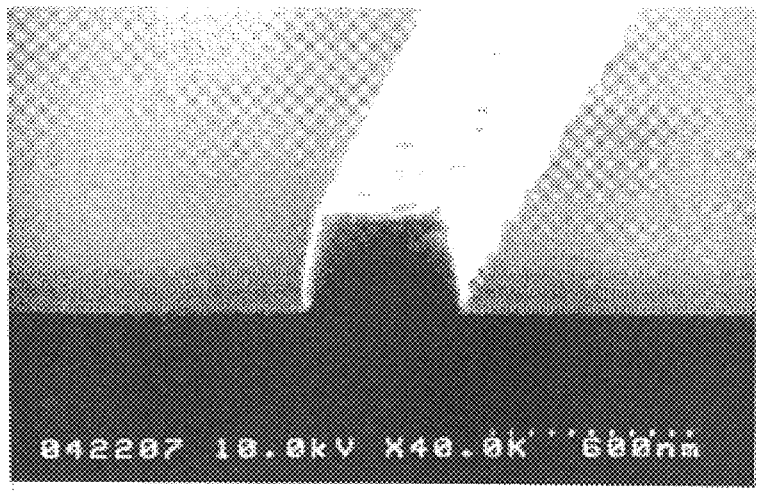
FIGS. 9(a)–9(b) show SEM cross sections of isolated projections at a gas flow rate of 75 sccm for the following gas pressures: (i) 20 millitorr and (ii) 100 millitorr.
Figure 9B:
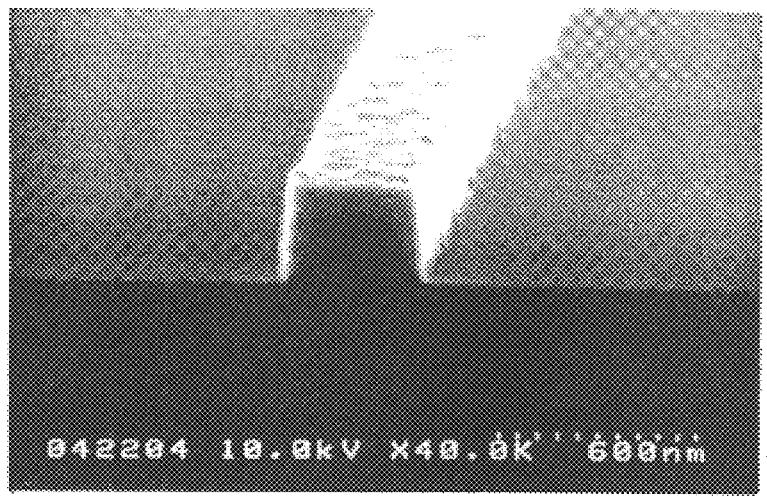

FIGS. 9(a) and (b) show SEM cross sections of isolated projections at a gas flow rate of 75 sccm for the following gas pressures: (i) 20 millitorr; and (ii) 100 millitorr. As can be seen from the FIG. 9(a) SEM photograph (the gas pressure: 20 millitorr), the isolated-projection bottom dimension is greater than the top dimension and the CD difference is great. On the other hand, in the FIG. 9(b) SEM photograph (the gas pressure: 100 millitorr), the CD difference is much improved in comparison with the FIG. 9(a) case.

Figure 10:
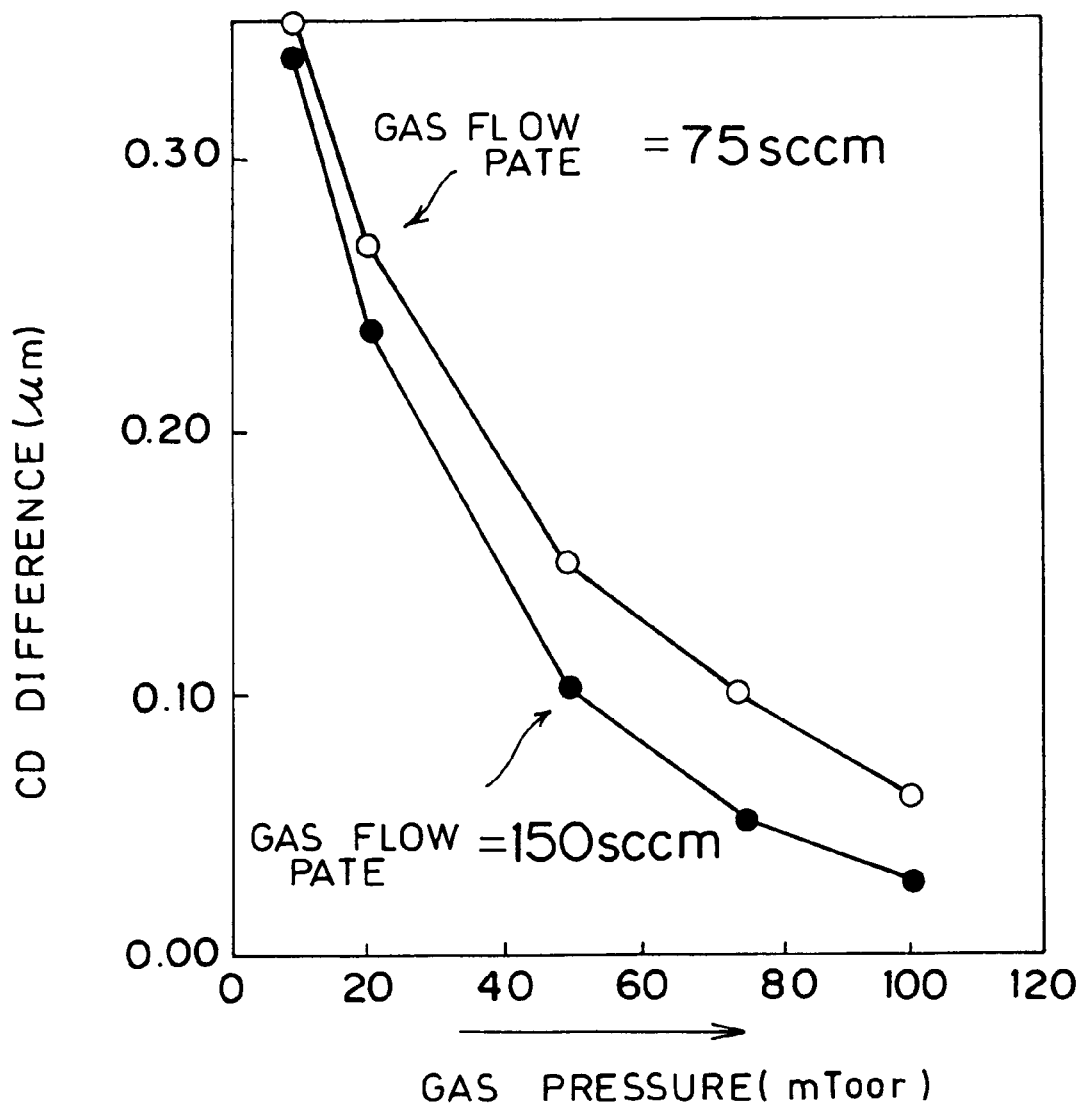
FIG. 10 shows the CD difference at various gas pressures.
Figure 11:
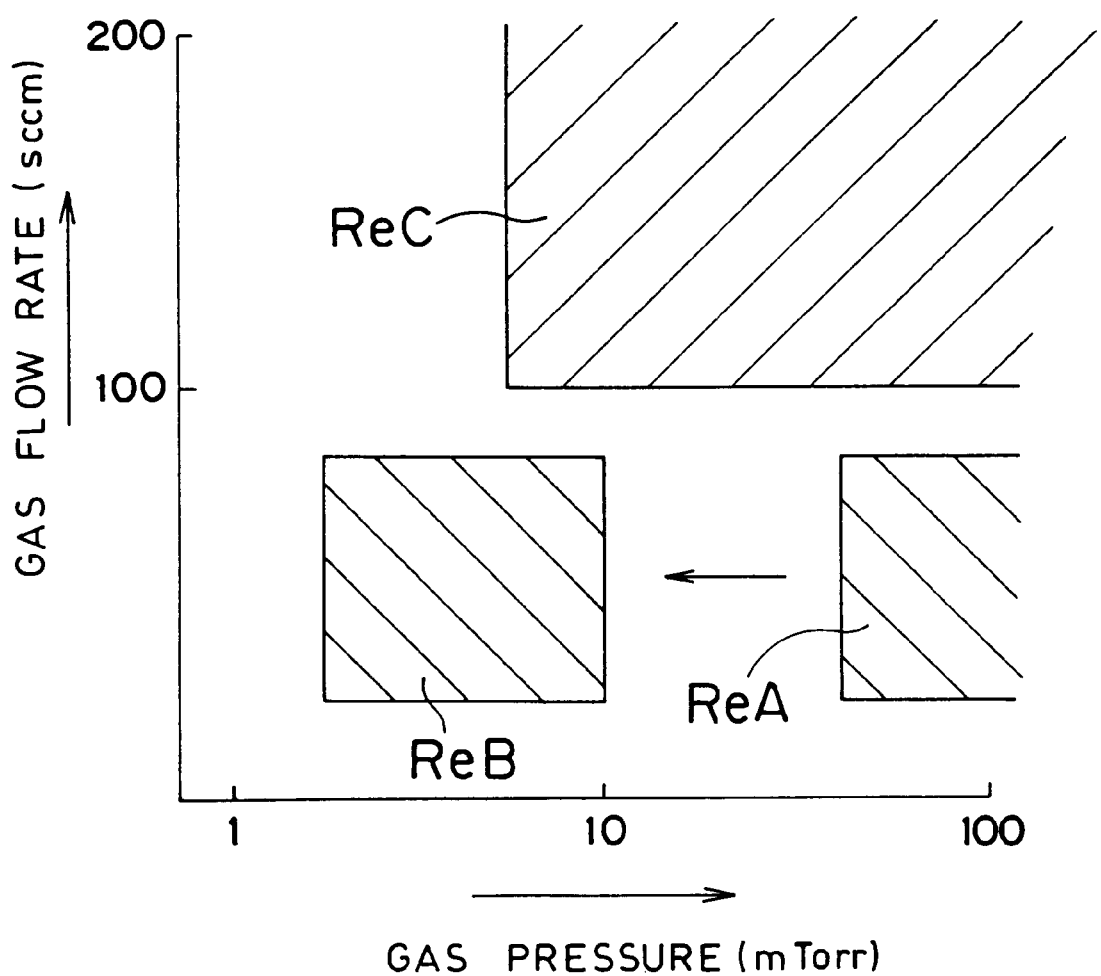
FIG. 11 is a map showing the difference in gas pressure/flow rate between a dry etching process of the present invention and a conventional dry etching process.

FIG. 10 is a graph showing the CD difference of isolated projections for the gas pressure for the following gas flow rates: (i) 75 sccm; and (ii) 150 sccm. It is shown that when the gas flow rate is 75 sccm the CD difference can be reduced to below 0.04 µm at gas pressures above about 130 millitorr by extrapolation of this data. When the gas flow rate is 150 sccm the CD difference can be reduced to below 0.04 µm at gas pressures above about 90 millitorr.

FIG. 10 is a map showing the gas flow rate versus the gas pressure for making a comparison between a dry etching technique of the present invention and a conventional dry etching technique.

In early dry etching techniques, REGION ReA was used, in other words dry etching was performed in relatively low vacuum (high pressure) at a relatively low gas flow rate. In recent years, however, dry etching has been performed using REGION ReB, in other words in high vacuum (low pressure) at a relatively low gas flow rate. Japanese Patent Applications, published under Pub. Nos. 5-259119, 5-267227, 5-267249, and 5-275376, respectively, aim at controlling the amount of adhesion of an active species to an etching sidewall by changing the rate of exhaust by means of an ECR-type high vacuum etcher. Such, however, has not resulted in cancelling isolated-projection CD differences, the reason for which is considered such that the state of gas is not a viscous flow. As a result, it is hard for the conventional techniques to reduce the CD difference variation.

Conversely, in the present invention REGION ReC is used for dry etching, in other words dry etching is performed in relatively low vacuum (high pressure) at a relatively high gas flow rate. This makes it possible to almost cancel isolated-projection CD differences.

As a rule of thumb, in order to achieve the effect of the presents invention, the gas pressure P must be greater than or equal to 5 millitorr if the chamber diameter d is 30 cm. It is preferable that the product of P and d (P·d) falls in the following range.

P·d≧5 (millitorr)×30 (cm)
=1.5×10⁻³ (Torr·m)
=1.5×10⁻³×1.33 Pa·m
=1.5×10⁻³×1.33 (Kg/m)·sec 2·m
=0.2 Kg/sec²

Semiconductor materials (Si, poly-Si (doped and undoped), amorphous Si, GaAS, GaN, AlGaAs, InGaAs, AlP, AlAs, InP, InAs, and InSb), metallic materials (Al, Cu, Cu alloy, Al alloy, W, T, Co, Ta, Mo, and Nb), and silicide materials (WSix, TiSix, CoSix) are materials for a portion to be etched capable of being patterned.

Accordingly not only the effect of protecting the sidewalls of isolated projections but also their cross sections can be controlled freely by controlling the gas flow rate.

Embodiment 3

Figure 12:
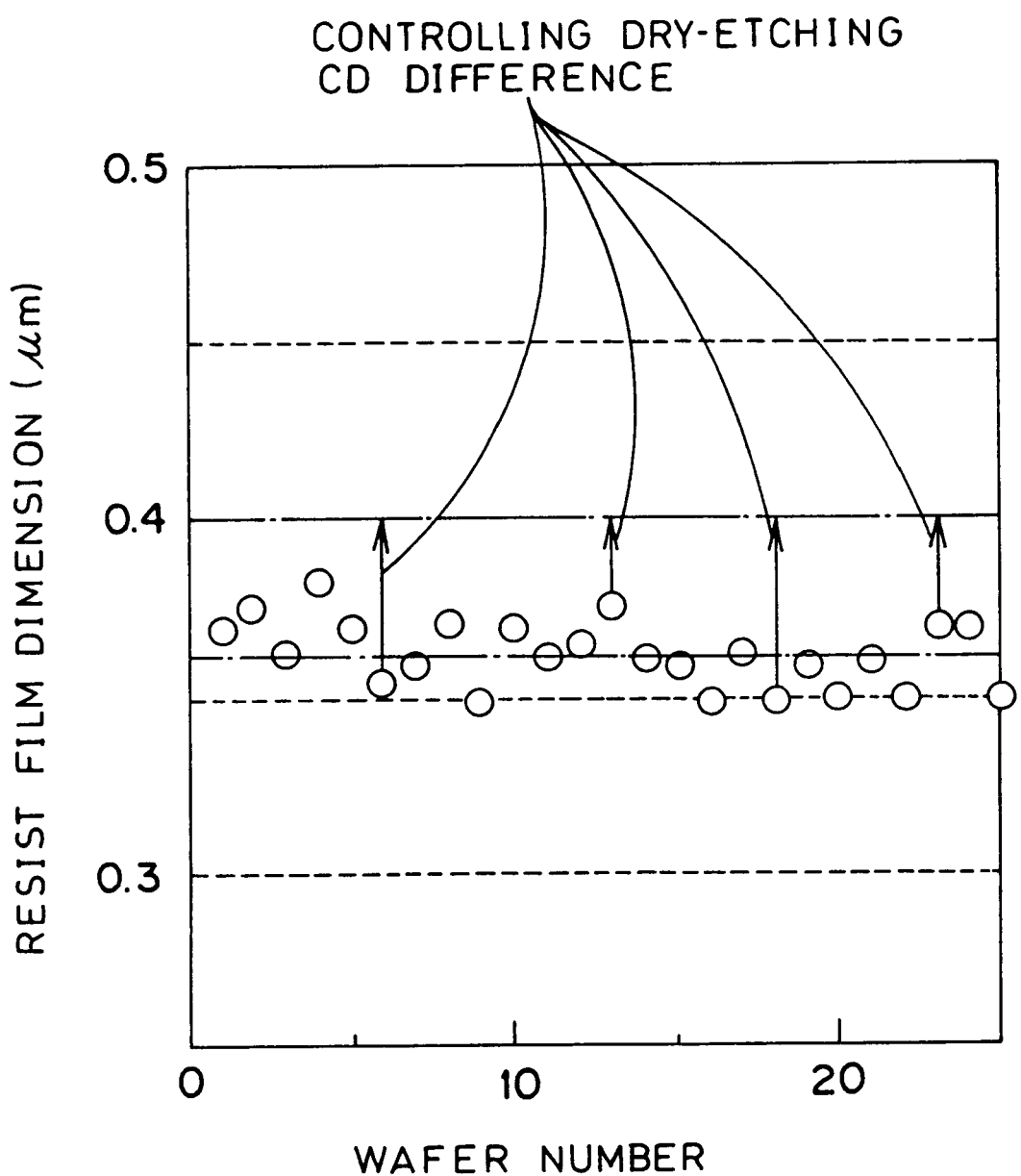
FIG. 12 is a diagram useful in understanding the relationship between a photolithography CD difference and a dry-etching CD difference in a third embodiment of the present invention.
Figure 13:
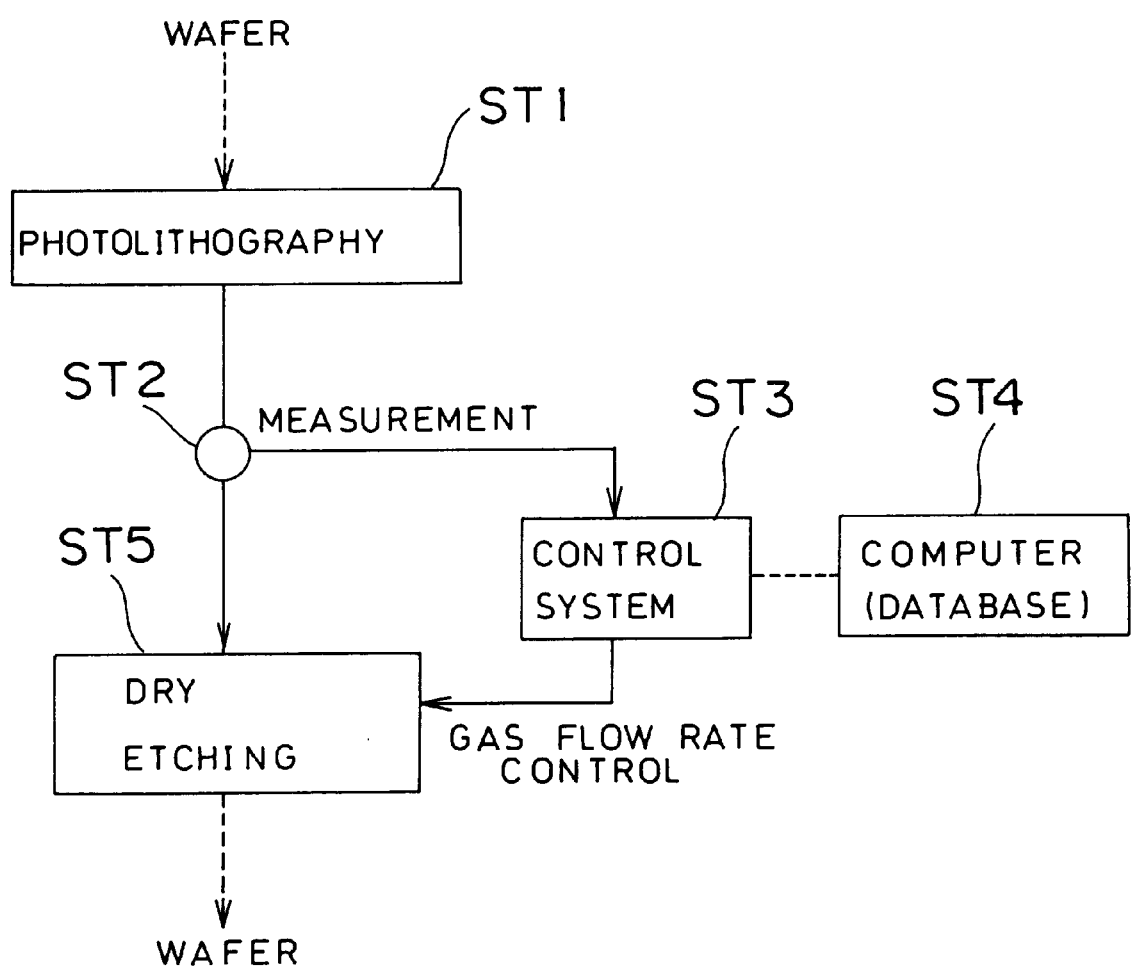
FIG. 13 is a flowchart showing a photolithography process and a dry etching process in accordance with the third embodiment.

A third embodiment of this invention is described. Referring to FIGS. 12 and 13, a principle of controlling the CD difference according to the third embodiment is illustrated.

FIG. 12 is a diagram useful in understanding a principle of controlling the CD difference in a photolithography process as well as in a dry etching process. FIG. 13 is a flowchart showing sequential steps of forming on a wafer a semiconductor device component such as a MOSFET polysilicon gate. In FIG. 13, taking note of the dependence of the CD difference upon the gas flow rate described above, a way of controlling the flow rate of gas in a dry etching process is illustrated.

Referring now to FIG. 13, each semiconductor wafer is subjected to a photolithography process and a photoresist film (i.e., an etch mask) having a predetermined pattern is formed at step ST1. Taking into account a CD gain that is produced in a later dry etching process, a photoresist film is formed such that an isolated projection that becomes a gate electrode is formed having a dimension smaller than its finish dimension (gate length) of 0.4 μm by 0.04 μm. Such a resist film dimension can be obtained easily if a location of a reticle pattern corresponding to the isolated projection is made to have a dimension smaller by a sum of a dry-etching CD difference of 0.04 μm CD and a photolithography CD difference.

At step ST2, measurement of the remaining portions of the resist films formed over the individual wafers is performed and the results are stored per wafer. Also in the photolithography process, the CD difference (i.e., the difference in the dimension between a reticle pattern and a resist pattern) is produced and variations in the CD difference occur, which is described later. In other words, even at the same locations in the wafers, the remaining portions covering MOSFET gate formation regions have different dimensions (see FIG. 12). set for each wafer through the control system. As shown in FIG. 12, the difference between the dimension of a remaining portion and the finish gate length of a gate electrode (0.4 μm becomes a target dry-etching CD difference. Therefore, if dry-etching parameters, i.e., the gas pressure and the gas flow rate, are modified per wafer for CD difference control, this should produce a polysilicon gate having a dimension of 0.4 μm.

Figure 14:
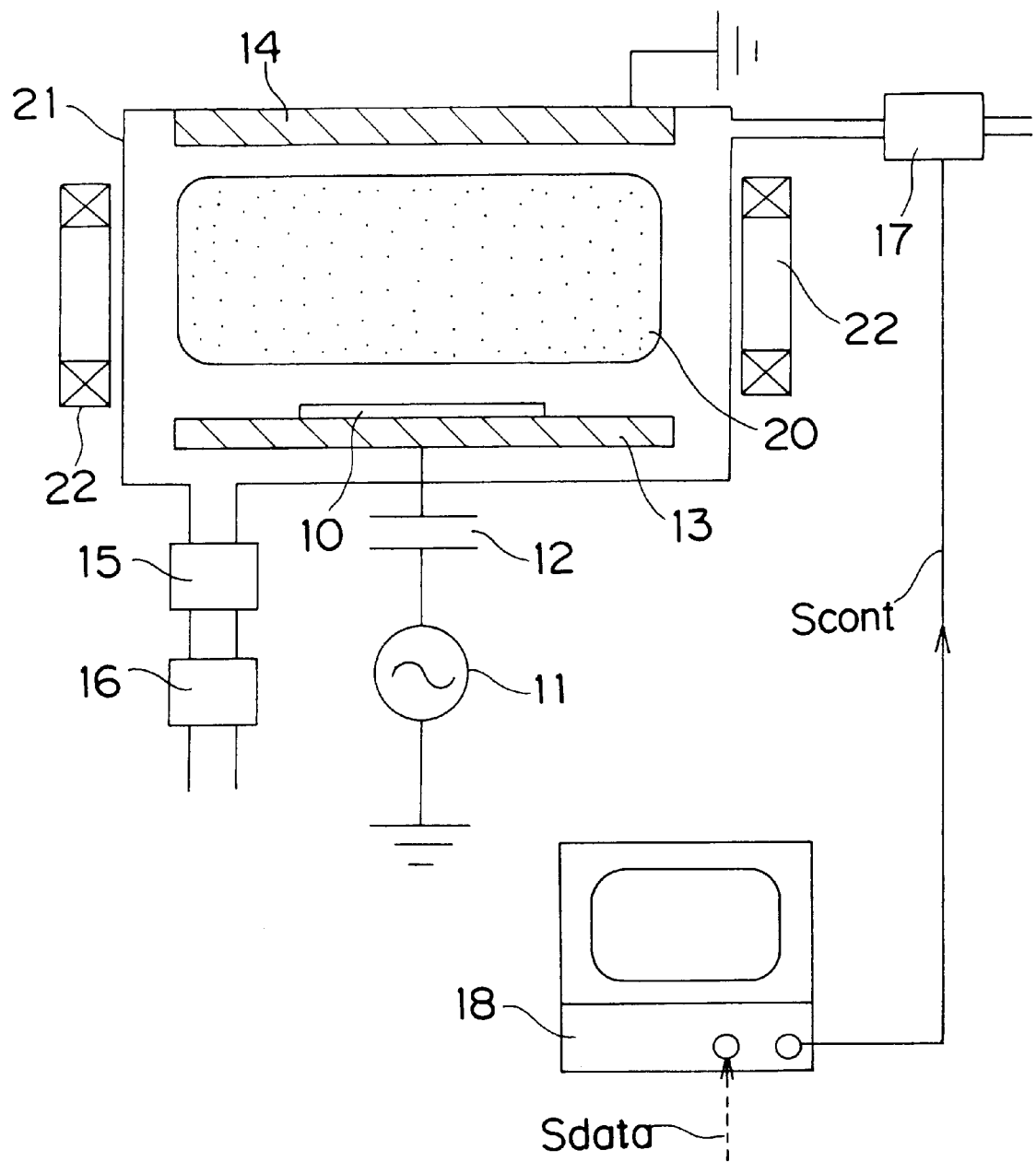
FIG. 14 schematically depicts a dry etching apparatus used in the third embodiment.

FIG. 14 outlines the structure of a magnetron RIE apparatus for performing a dry etching process. Like the first embodiment, the present embodiment uses a sample that is formed as follows (see FIG. 3). Polysilicon, which is a gate electrode material, is deposited on an LSI semiconductor wafer that has undergone an element isolation process and a gate oxidization process. A photoresist film is applied to the LSI semiconductor wafer and thereafter a photolithography process is carried out to form an etch mask. As a source of exposure light, i-lines are used.

In FIG. 14, elements are denoted as follows. Like the magnetron RIE apparatus of the first embodiment, the present magnetron RIE apparatus has the following elements. 21 is a reaction chamber. 22 is an electromagnetic coil. 10 is an LSI semiconductor wafer. 11 is a high-frequency power source (e.g., 13.56 MHz). 12 is a coupling capacitor. 13 is a cathode electrode. 14 is an anode electrode. 15 is a turbo molecular pump. 16 is a rotary pump. 17 is a mass flow In FIG. 14, elements are denoted as follows. Like the magnetron RIE apparatus of the first embodiment, the present magnetron RIE apparatus has the following elements. 21 is a reaction chamber. 22 is an electromagnetic coil. 10 is an LSI semiconductor wafer. 11 is a high-frequency power source (e.g., 13.56 MHz). 12 is a coupling capacitor. 13 is a cathode electrode. 14 is an anode electrode. 15 is a turbo molecular pump. 16 is a rotary pump. 17 is a mass flow controller. 20 indicates a plasma generation region. Anode electrode 14 is grounded. Gas within reaction chamber 21 is discharged by turbo molecular pump 15 and rotary pump 16 to outside through an outlet. Mass flow controller 17 controls the flow rate of inflow gas to reaction chamber 21.

In addition to the above-described elements, 18 is a computer. Computer 18 controls mass flow controller 17 according to the dimensional data in a photolithography process, to change a gas flow rate. In other words, computer 18 receives a data signal $S_{data}$ which carries dimensional data as to the resist film obtained in a photolithography process and outputs a control signal $S_{cont}$ to mass flow controller 17.

At the time of performing a dry etching process, reaction chamber 21 is filled with gas in a viscous region at a gas pressure of 100 millitorr. Thereafter, 215 W of electric power from high-frequency power source 11 propagates to cathode electrode 13 via coupling capacitor 12. This electric power, together with a magnetic field produced by electromagnetic coil 22, ionizes an etch gas formed of HBr gas and $Cl_2$ gas introduced into reaction chamber 21, to create plasma generation region 20. Polysilicon is etched, in an ion assist manner, by both Br radicals that are active species dissociated from the HBr gas and Cl radicals dissociated from the $Cl_2$ gas.

Figure 15:
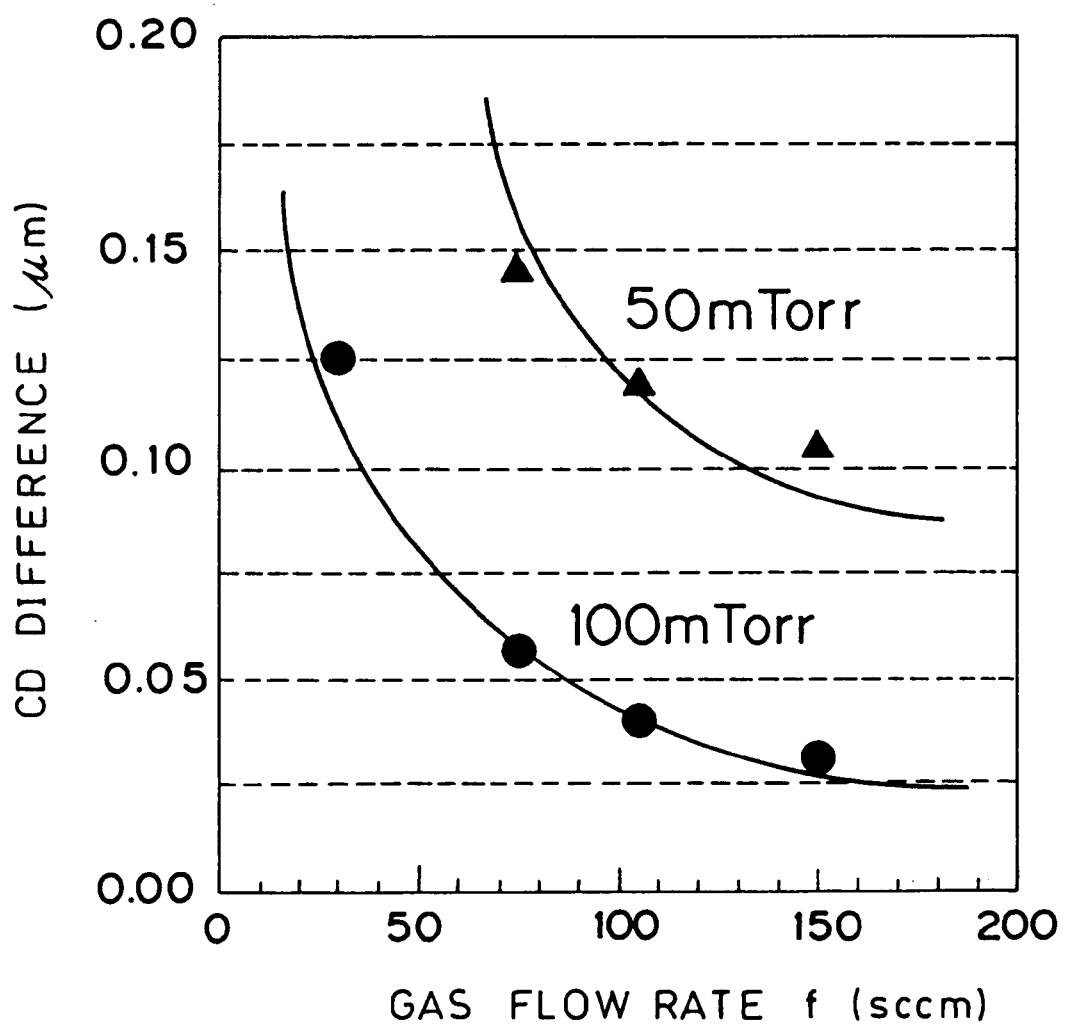
FIG. 15 shows the CD difference at various gas flow rates for gas flow rate control in the third embodiment.

In the present embodiment, the relationship between a CD difference and a gas flow rate is approximated by hyperbolic functions. FIG. 15 is a graph resulting from arranging the data of FIGS. 4(a) and 4(b). As can be seen from FIG. 15, the relationship between d (the CD difference) and f (the gas flow rate) can be approximated within a certain range by hyperbolic functions. Depending on the gas pressure, approximation can be made if d varies inversely with f.

For example, the relationship between d (μm) and f (sccm) at a gas pressure of 100 millitorr may be approximated by: d=A/f(A=4).

Such a relationship is used for gas flow rate control so that individual wafers contain their respective polysilicon gates having the same finish dimension. More specifically, if a target finish dimension is 0.4 μm and an average resist film dimension is 0.38 μm, then the gas flow rate is set such that a CD gain of 0.02 μm occurs in a dry etching process. If an average resist film dimension is 0.36 μm, then the gas flow rate is set such that a CD gain of 0.04 μm occurs in a dry etching process. The gas flow rate is controlled per wafer and an etching process is performed.

Figure 16A:
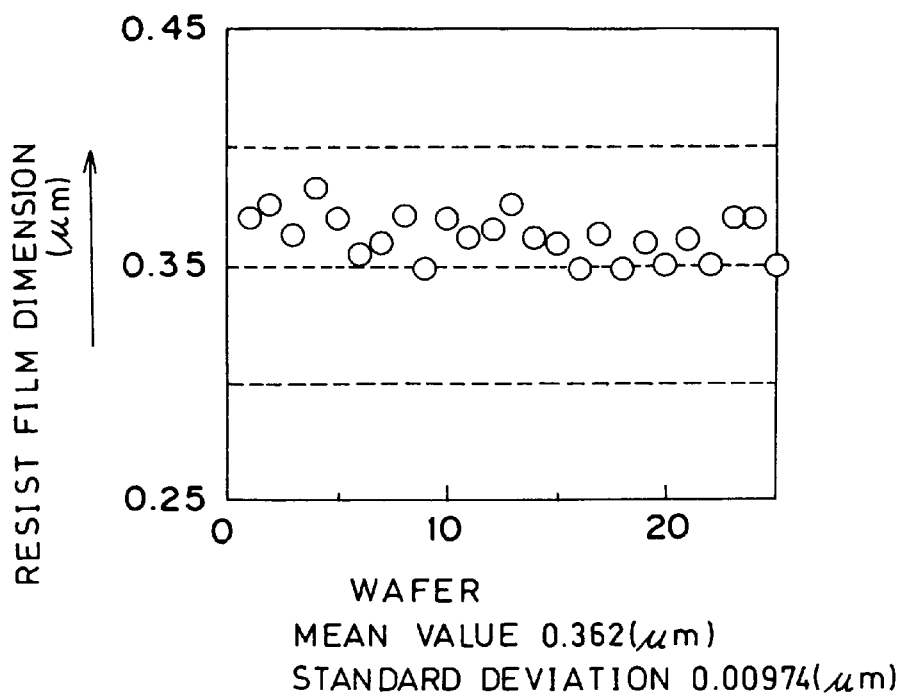
FIG. 16(a) shows the dimensions of resist films on individual semiconductor wafer samples dry-etched in accordance with the third embodiment and FIG. 16(b) shows the dimensions of resist films on individual semiconductor wafer samples dry-etched in accordance with a conventional technique.
Figure 16B:
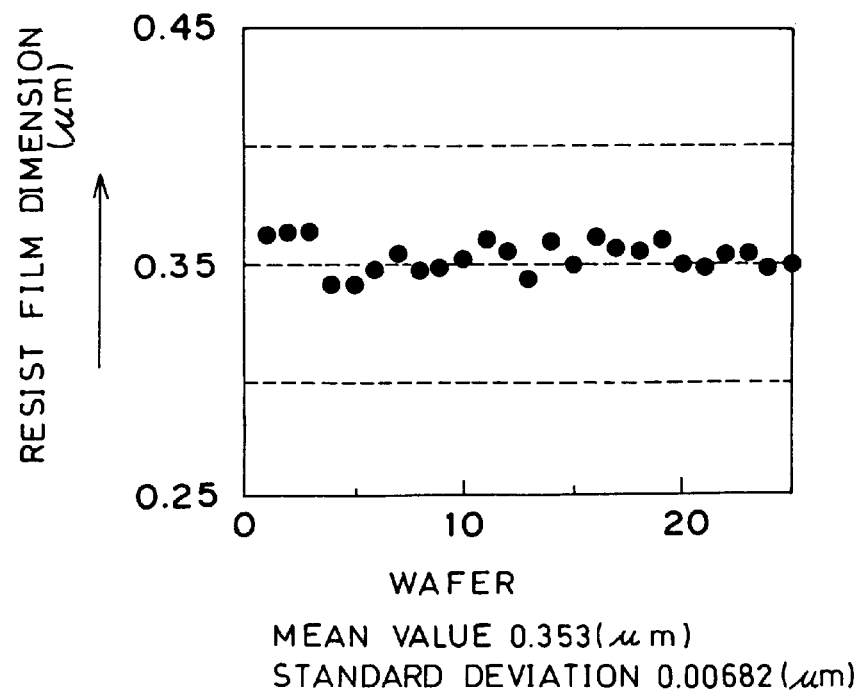

FIGS. 16(a) and 16(b) each show the dimension of remaining portions in a photolithography process. FIG. 16(a) shows data about samples to be dry etched in accordance with the present fabrication method. FIG. 16(b) shows data about samples to be dry etched in accordance with a conventional fabrication method.

Figure 17A:
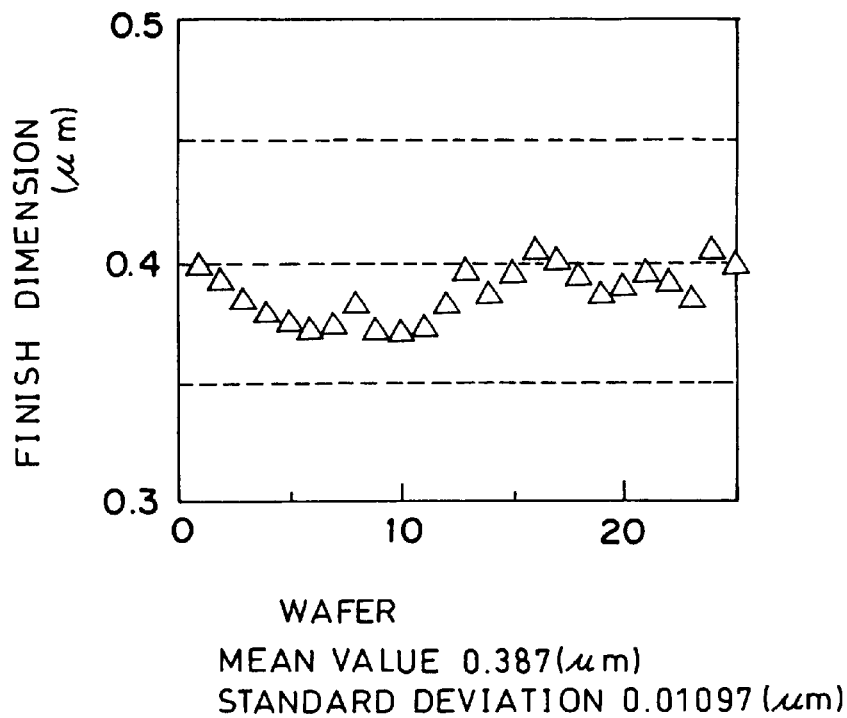
FIG. 17(a) shows the finish dimensions of polysilicon gates produced by a dry etching process in accordance with the third embodiment and FIG. 17(b) shows the finish dimensions of polysilicon gates produced by a conventional dry etching process.
Figure 17B:
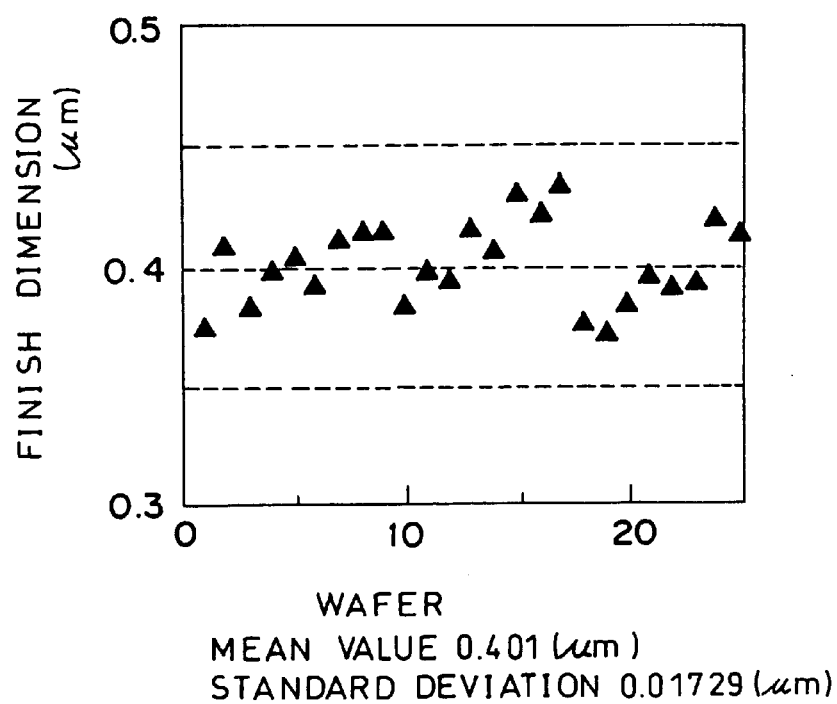
Figure 18A:
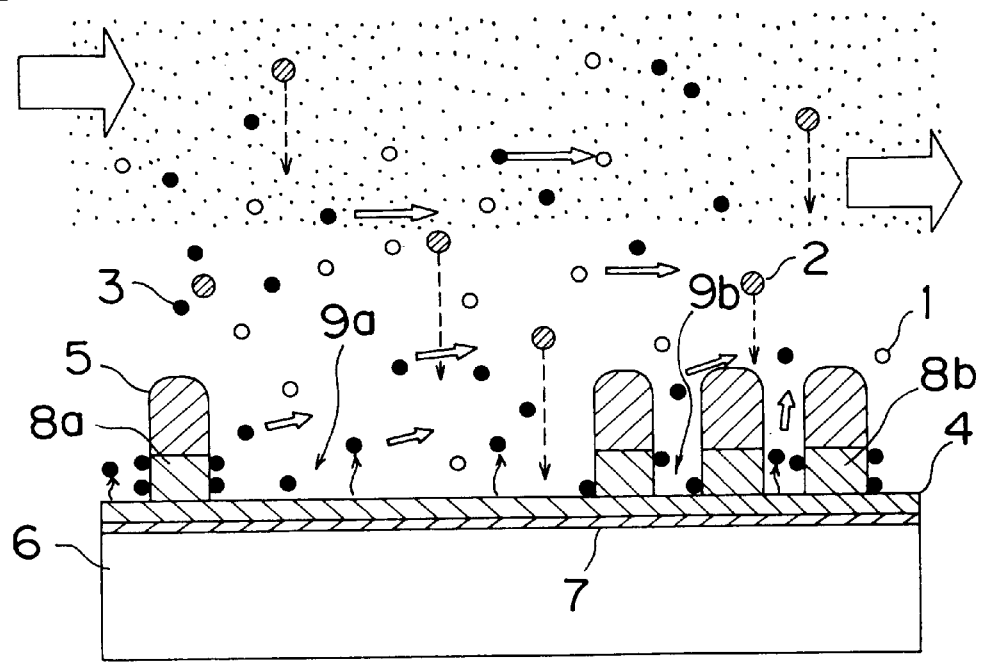
FIGS. 18(a)–18(c) illustrate in cross section a silicon substrate, an isolated projection, and a closely spaced projection, respectively, in a conventional dry etching process.
Figure 18B:
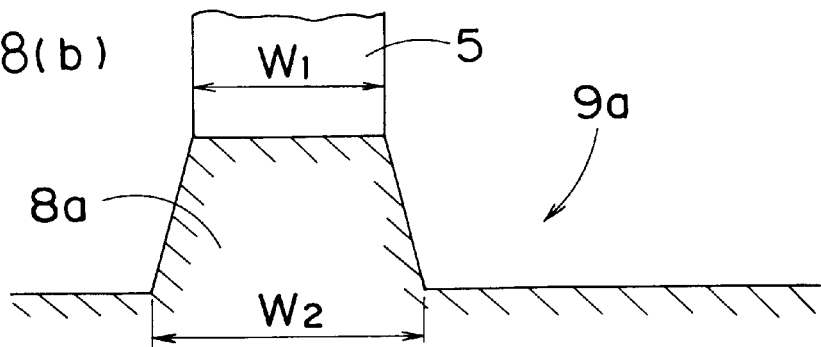
Figure 18C:
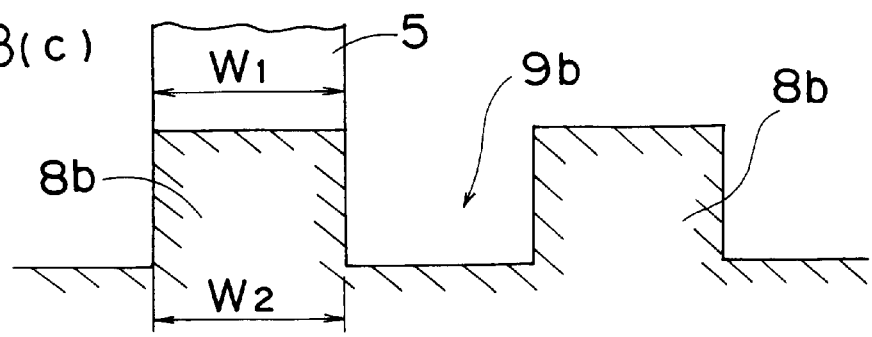

FIGS. 17(a) and 17(b) each show the bottom dimension of final polysilicon gates (isolated projections), i.e., the finial gate length, for respective wafers. FIG. 17(a) shows data in accordance with the present embodiment in which the gas flow rate is controlled. FIG. 17(b) shows data in accordance with a conventional method in which the gas flow rate is not controlled.

In accordance with the present invention, in order to rectify photolithography CD differences, dry-etching CD differences are controlled such that the mean value of the finish dimension of portions to be etched (polysilicon gates) almost corresponds to a target value. Pre-dry etching variation in the resist film dimension, when converted to standard deviations, is 0.00974 μm (see FIG. 16(a)). Post-dry etching variation in the gate length finish dimension, when converted to standard deviations, is 0.010907 μm (see FIG. 17(a)). In other words, control of the gas flow rate reduces the degree of post-dry etching variation in the finish dimension down to almost the same extent as the degree of variation in the photolithography process. That is, in order to cancel variations in the etch mask dimension produced in a photolithography process, dry-etching CD differences are controlled, whereupon variations in the finish dimension of polysilicon gates are reduced.

In accordance with the conventional method, pre-dry etching variation in the resist film dimension, when converted to standard deviations, is 0.00682 μm (see FIG. 16(b)). Post-dry etching variation in the gate length finish dimension, when converted to standard deviations, is 0.01729 μm (see FIG. 17(b)). In other words, variation in the dimension produced in a photolithography process is superposed on variation in the dimension produced in a dry etching process and, resulting variation in the dimension of portions to be etched is about 2.5 times variation in the resist film dimension.

Conversely, in the present embodiment, dry etching is performed while controlling the gas flow rate. This almost cancels variations in the resist film dimension in the photolithography process thereby reducing variations in the finish dimension of portions to be etched. Therefore, sufficient processing accuracy is achieved, which improves the uniformity of performance of devices as well as the yield of products.

Neither changes in the etch characteristic, variations in the etch rate, nor charge-up damage due to such gas flow rate control was observed.

Additionally, under the condition that the gas pressure is 50 millitorr (FIG. 15), the relationship between d (the CD difference) and f (the gas flow rate) in the vicinity of 75–200 sccm may be approximated by: $(d-do)(f-fo)=A$. In this case, if data is substituted in these hyperbolic functions and a method such as a least squares method is used, then the following is obtained.

do=0.0075 (μm)

fo=37.5 (sccm)

A=2.81

In this case, d=do becomes an asymptote of the hyperbolic function, which shows that it is hard to obtain a CD difference below "do" at this pressure at gas flow rates of 75–200 sccm. On the other hand, where a fixed CD difference, d1, is a target value to be obtained, the gas pressure is set such that "do" is near "d1" but below "d1". As a result of such arrangement, the CD difference "d" does not change much, even when the gas flow rate somewhat changes, and the CD difference becomes fixed, accordingly.

The invention claimed is:

1. A method of fabricating a semiconductor device, wherein a dense region of the semiconductor device comprises a dense arrangement of a plurality of first recesses each with a lateral dimension of 1 μm or less and a plurality of first projections interposed between the first recesses, and a sparse region of the semiconductor device comprises a sparse arrangement of a plurality of second recesses each with a lateral dimension of 1 μm or more and a plurality of second projections interposed between the second recesses, said dense and sparse regions being formed by using an etch mask and etching a semiconductor substrate in a reaction chamber, said method comprising:

a first step of forming the etch mask on the semiconductor substrate, said etch mask having a dense region with a dense arrangement of a plurality of first mask portions each having a lateral dimension and a plurality of first opening portions interposed between the first mask portions, and having a sparse region with a sparse arrangement of a plurality of second mask portions each with a lateral dimension different than the lateral dimension of each of the first mask portions and a plurality of second opening portions interposed between the second mask portions; and a second step of dry etching a layer of the semiconductor substrate, wherein a pressure and a flow rate of an etch gas discharged in the reaction chamber are controlled such that the lateral dimension of a lower part of each of the second recesses becomes close to a desired dimension that is larger than the lateral dimension of each of the second mask portions.

2. The method for fabricating a semiconductor device according to claim 1, further comprising:

before the first step, a step of determining relationships between the pressure and the flow rate of the etch gas and a first critical dimension difference that is a difference in lateral dimension between each of the first mask portions and a lower part of each of the first projections, and between the pressure and the flow rate of the etch gas and a second critical dimension difference that is a difference in lateral dimension between each of the second mask portions and a lower part of each of the second projections, by conducting an experimental dry etching using an experimental etch mask under different etching conditions with respect to the pressure and flow rate of the etch gas, and storing the relationships in the form of a database;

after the step of determining relationships and before the first step, a step of measuring a difference between the lateral dimension of each of the second mask portions of the etch mask and the desired dimension; and after the step of measuring and before the first step, a step of performing arithmetic operations, based on the stored relationship between the pressure and flow rate of the etch gas and the second critical dimension difference, to find values for the pressure and the flow rate of the etch gas, wherein such values allow the second critical dimension difference to be equal to the measured difference between the lateral dimension of each of the second mask portions of the etch mask and the desired dimension; and wherein the dry etching of the second step is performed at the pressure and the flow rate of the etch gas found pursuant to the arithmetic operations.

3. The method of fabricating a semiconductor device according to claim 2, wherein a desired value for the lateral dimension of each of the second mask portions of the etch mask is equal to the lateral dimension of the lower part of each of the second projections when the pressure and flow rate of the etch gas are at values that allow the lateral dimension of the lower part of each of the first projections to be substantially equal to the lateral dimension of each of the first mask portions, which is obtained from the stored data base.

4. A method of fabricating a semiconductor device according to claim 1, wherein the pressure of the etch gas is greater than or equal to 5 millitorr and the flow rate of the etch gas is greater than or equal to 100 sccm.

5. A method of fabricating a semiconductor device according to claim 1, wherein a product of the pressure of the etch gas and a diameter of the reaction chamber is greater than or equal to 0.2 Kg/sec$^2$.

6. A method of fabricating a semiconductor device according to claim 1, wherein the etch gas contains at least either one of a halogen gas and a halide gas.

7. A method of fabricating a semiconductor device according to claim 1, wherein the halogen gas is either of a hydrogen bromide gas, a mixture of a hydrogen bromide gas and a chlorine gas, and a mixture of a hydrogen bromide gas and a hydrogen chloride gas.

8. A method of fabricating a semiconductor device according to claim 1, wherein layer of the semiconductor substrate to be etched comprises at least either one of single crystal silicon, polysilicon, Al, Cu, W, Ti, Co, Ta, Mo, and Ni.

9. A method of fabricating a semiconductor device according to claim 1, wherein the flow rate of the etch gas in the reaction chamber is greater than or equal to 100 sccm and the pressure of the etch gas in the reaction chamber is greater than 10 millitorr.

* * * * *